US012690315B2

(12) United States Patent
Luo et al.

(10) Patent No.: US 12,690,315 B2
(45) Date of Patent: Jul. 21, 2026

(54) METHOD OF ALLOCATING WIDTHS FOR TARGET SIGNAL LINES, WIRING SUBSTRATE, LIGHT-EMITTING SUBSTRATE AND DISPLAY DEVICE

(71) Applicants: Hefei BOE Ruisheng Technology Co., Ltd., Hefei (CN); BOE TECHNOLOGY GROUP CO., LTD., Beijing (CN)

(72) Inventors: Ningyu Luo, Beijing (CN); Zouming Xu, Beijing (CN); Xintao Wu, Beijing (CN); Jie Wang, Beijing (CN); Jiawei Xu, Beijing (CN); Tingwei Han, Beijing (CN)

(73) Assignees: HEFEI BOE RUISHENG TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 381 days.

(21) Appl. No.: 18/577,518

(22) PCT Filed: Jun. 30, 2022

(86) PCT No.: PCT/CN2022/103126
§ 371 (c)(1),
(2) Date: Jan. 8, 2024

(87) PCT Pub. No.: WO2024/000516
PCT Pub. Date: Jan. 4, 2024

(65) Prior Publication Data
US 2024/0243241 A1 Jul. 18, 2024

(51) Int. Cl.
H10H 20/857 (2025.01)
H10W 90/00 (2026.01)
H10H 20/01 (2025.01)

(52) U.S. Cl.
CPC .......... H10H 20/857 (2025.01); H10W 90/00 (2026.01); H10H 20/0364 (2025.01)

(58) Field of Classification Search
CPC . H10H 20/857; H10H 20/0364; H10W 90/00; H10K 59/10
See application file for complete search history.

(56) References Cited

U.S. PATENT DOCUMENTS

| | | | |
|---|---|---|---|
| 12,293,698 B2 * | 5/2025 | Yu | G09G 3/32 |
| 12,538,673 B2 * | 1/2026 | Wang | H10K 59/131 |

(Continued)

FOREIGN PATENT DOCUMENTS

| | | | | |
|---|---|---|---|---|
| CN | 107608104 A | * | 2/2018 | |
| CN | 111564456 A | * | 8/2020 | H10D 86/60 |

(Continued)

*Primary Examiner* — Laura M Menz
(74) *Attorney, Agent, or Firm* — Myers Bigel, P.A.

(57) ABSTRACT

A method of allocating widths for target signal lines, a wiring substrate, a light-emitting substrate and a display device are provided. The method includes numbering the target signal lines; performing the following operations at least once until the number of target signal lines in a set is zero, determining the set of target signal lines; determining a region R based on the conditions satisfied by a voltage drop V, a temperature rise T, and widths W of the target signal lines, determining the number i of the target signal line with the maximum voltage drop in the set; substituting a known length $L_i$ of the target signal line numbered i into V (L, W) to obtain V ($L_i$, W) and obtaining $W_i$ based on an intersection of V ($L_i$, W) and a boundary of the region R, and removing the target signal line with the width $W_i$ from the set.

18 Claims, 7 Drawing Sheets

(56)                    References Cited

U.S. PATENT DOCUMENTS

| | | | | |
|---|---|---|---|---|
| 2018/0367318 A1* | 12/2018 | Lu | ................. | G06F 21/44 |
| 2024/0243241 A1* | 7/2024 | Luo | ................. | H10H 20/857 |
| 2024/0296781 A1* | 9/2024 | Yang | ................. | G09G 3/32 |
| 2025/0008792 A1* | 1/2025 | An | ................. | H10K 59/1213 |
| 2025/0022889 A1* | 1/2025 | Liu | ................. | H10D 86/60 |
| 2025/0314928 A1* | 10/2025 | Su | ................. | G02F 1/133603 |

FOREIGN PATENT DOCUMENTS

| | | | | | |
|---|---|---|---|---|---|
| CN | 107608104 B | * | 9/2020 | | |
| CN | 112861467 A | * | 5/2021 | ............ | G06F 30/398 |
| CN | 215451419 U | * | 1/2022 | | |
| CN | 115719748 A | * | 2/2023 | | |
| CN | 116075183 A | * | 5/2023 | ............ | H10K 59/131 |
| CN | 116669485 A | * | 8/2023 | ............ | G09G 3/3258 |
| CN | 116863819 A | * | 10/2023 | ............ | G09F 9/30 |
| CN | 117795400 A | * | 3/2024 | ............ | H10W 90/00 |
| CN | 117859204 A | * | 4/2024 | ......... | G02F 1/133612 |
| CN | 117897750 A | * | 4/2024 | ............ | H10W 90/00 |
| CN | 119029126 A | * | 11/2024 | ............ | H10W 90/00 |
| CN | 119325277 A | * | 1/2025 | ............ | H10D 86/441 |
| CN | 119731589 A | * | 3/2025 | ............ | H10W 20/43 |
| CN | 120419327 A | * | 8/2025 | ............ | G09F 9/33 |
| CN | 120583853 A | * | 9/2025 | ............ | B60Q 1/30 |
| CN | 112447812 B | * | 12/2025 | ............ | G06F 3/0446 |
| CN | 121241694 A | * | 12/2025 | ............ | H10W 90/00 |
| JP | 2002202711 A | * | 7/2002 | | |
| JP | 2023528706 A | * | 7/2023 | ............ | H10W 90/00 |
| WO | WO-2022174612 A1 | * | 8/2022 | ......... | H10K 59/1315 |
| WO | WO-2022178725 A1 | * | 9/2022 | ............ | G02F 1/13 |
| WO | WO-2022226950 A1 | * | 11/2022 | ......... | H10K 59/1315 |
| WO | WO-2023103034 A1 | * | 6/2023 | ............ | H10K 59/131 |
| WO | WO-2023206078 A1 | * | 11/2023 | ............ | H10W 90/00 |
| WO | WO-2023226017 A1 | * | 11/2023 | ............ | H10W 90/00 |
| WO | WO-2024000516 A1 | * | 1/2024 | ............ | H10W 90/00 |
| WO | WO-2024031371 A1 | * | 2/2024 | ............ | H05K 1/02 |
| WO | WO-2024031372 A1 | * | 2/2024 | ......... | G02F 1/133612 |
| WO | WO-2025043414 A1 | * | 3/2025 | ............ | H10K 59/131 |
| WO | WO-2025111959 A1 | * | 6/2025 | ............ | G09F 9/33 |
| WO | WO-2025199934 A1 | * | 10/2025 | ............ | G09F 9/33 |
| WO | WO-2025227358 A1 | * | 11/2025 | ............ | H10K 59/131 |

* cited by examiner

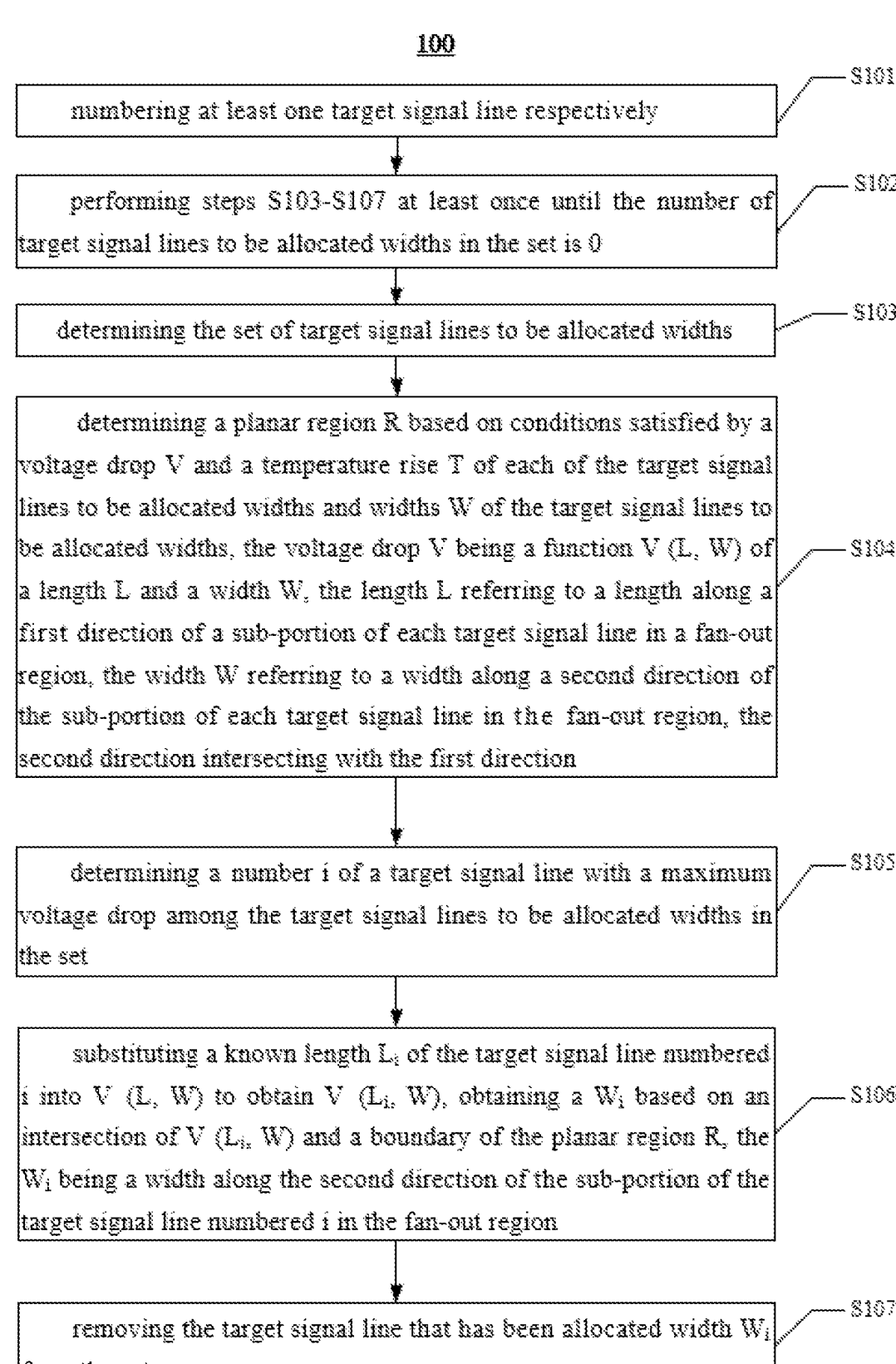

<u>100</u> numbering at least one target signal line respectively — S101 performing steps S103-S107 at least once until the number of target signal lines to be allocated widths in the set is 0 — S102 determining the set of target signal lines to be allocated widths — S103 determining a planar region R based on conditions satisfied by a voltage drop V and a temperature rise T of each of the target signal lines to be allocated widths and widths W of the target signal lines to be allocated widths, the voltage drop V being a function V (L, W) of a length L and a width W, the length L referring to a length along a first direction of a sub-portion of each target signal line in a fan-out region, the width W referring to a width along a second direction of the sub-portion of each target signal line in the fan-out region, the second direction intersecting with the first direction — S104 determining a number i of a target signal line with a maximum voltage drop among the target signal lines to be allocated widths in the set — S105 substituting a known length $L_i$ of the target signal line numbered i into V (L, W) to obtain V ($L_i$, W), obtaining a $W_i$ based on an intersection of V ($L_i$, W) and a boundary of the planar region R, the $W_i$ being a width along the second direction of the sub-portion of the target signal line numbered i in the fan-out region — S106 removing the target signal line that has been allocated width $W_i$ from the set — S107

FIG. 2 display device 700 wiring substrate light-emitting substrate

FIG.7

METHOD OF ALLOCATING WIDTHS FOR TARGET SIGNAL LINES, WIRING SUBSTRATE, LIGHT-EMITTING SUBSTRATE AND DISPLAY DEVICE

RELATED APPLICATIONS

The present application is a 35 U.S.C. 371 national stage application of PCT International Application No. PCT/CN2022/103126 filed on Jun. 30, 2022, the entire disclosure of which is incorporated herein by reference.

TECHNICAL FIELD

The present disclosure relates to the field of display technology, and in particular to a method of allocating widths for target signal lines, a wiring substrate, a light-emitting substrate comprising the wiring substrate, and a display device.

BACKGROUND

Display devices generally comprise two categories: liquid crystal display devices and organic light-emitting diode display devices. Liquid crystal display devices are widely used due to their advantages such as thinness, lightness, good shock resistance, wide viewing angle, and high contrast. A liquid crystal display device generally comprises a display panel and a backlight, and the backlight is usually arranged on a non-display side of the display panel to provide a light source for display of the display panel. Characteristics such as contrast, brightness uniformity and stability of the liquid crystal display device are related to the structure and performance of the backlight. In recent years, Mini-LED has attracted widespread attention due to its excellent performance, and has been increasingly used in the backlight.

SUMMARY

According to an aspect of the present disclosure, there is provided a method of allocating widths for target signal lines, comprising: numbering at least one target signal line respectively; performing the following operations at least once until a number of target signal lines to be allocated widths in a set is zero: determining the set of target signal lines to be allocated widths; determining a planar region R based on conditions satisfied by a voltage drop V and a temperature rise T of each of the target signal lines to be allocated widths and widths W of the target signal lines to be allocated widths, the voltage drop V being a function V (L, W) of a length L and a width W, the length L referring to a length of a sub-portion along a first direction, the width W referring to a width of the sub-portion along a second direction intersecting with the first direction, the sub-portion being a portion of each target signal line in a fan-out region and extending along the first direction; determining a number i of a target signal line with the maximum voltage drop among the target signal lines to be allocated widths in the set; substituting a known length $L_i$ of the target signal line numbered i into V (L, W) to obtain V ($L_i$, W), obtaining a $W_i$ based on an intersection of V ($L_i$, W) and a boundary of the planar region R, the $W_i$ being the width of the sub-portion of the target signal line numbered i along the second direction, the sub-portion of the target signal line numbered i being the portion of the target signal line numbered i in the fan-out region and extending along the first direction; and removing the target signal line that has been allocated width $W_i$ from the set.

In some embodiments, a number of the target signal lines is N, N is a positive integer greater than or equal to 2, the N target signal lines have N widths, a width of the target signal line with the maximum voltage drop among the N target signal lines is a maximum among the N widths.

In some embodiments, the temperature rise T is a function T (L, W) of the length L and the width W, the determining a planar region R based on conditions satisfied by a voltage drop V and a temperature rise T of each of the target signal lines to be allocated widths and widths W of the target signal lines to be allocated widths, comprises: determining the planar region R based on a set of inequalities consisting of the following inequalities: the voltage drop V (L, W) of each of the target signal lines to be allocated widths being less than a voltage drop threshold, the temperature rise T (L, W) of each of the target signal lines to be allocated widths being less than a temperature rise threshold, and a sum of the widths W of the target signal lines to be allocated widths being less than a dynamic width threshold.

In some embodiments, the determining a number i of a target signal line with the maximum voltage drop among the target signal lines to be allocated widths in the set, comprises: substituting $W_0$ into V (L, W) to obtain V (L, $W_0$), $W_0$ being associated with the dynamic width threshold; substituting the known length of each of the target signal lines to be allocated widths in the set into V (L, $W_0$) respectively to obtain a set of different voltage drops; selecting a maximum voltage drop from the set of different voltage drops; and determining the number i of the target signal line with the maximum voltage drop according to the known length corresponding to the maximum voltage drop.

In some embodiments, the voltage drop V (L, W) of each target signal line satisfies the following formula: V (L, W)=E+F*L/W, where both E and F are constants.

In some embodiments, $$V(L, W) = R_{pixel} * \sum_{j=1}^{j=k} I_j + R(L, W) * I_k,$$

the target signal lines are also in a functional region, the functional region comprises a plurality of partitions arranged in an array, $R_{pixel}$ is a resistance of a section of each target signal line corresponding to a single partition, k is a number of rows of the partitions, $I_j$=j*$I_0$, $I_k$=k*$I_0$, $I_0$ is a current of the single partition.

In some embodiments, R (L, W)=$R_s$*L/W, $R_s$ is a sheet resistance of the target signal line, E=k*(k+1)/2*$I_0$*$R_{pixel}$, F=k*$I_0$*$R_s$.

In some embodiments, the temperature rise T (L, W) of each target signal line satisfies the following formula: T (L, W)=[(1/(L*W*X)$^Y$)/(I/C)]$^{1/Q}$, where I is a current transmitted by each target signal line, X, Y, C, Q are constants.

According to another aspect of the present disclosure, there is provided a wiring substrate comprising: a base substrate comprising a fan-out region; and at least one target signal line on the base substrate and at least in the fan-out region, a sub-portion of each of the at least one target signal line having a length L along a first direction and a width W along a second direction intersecting with the first direction, the sub-portion being a portion of each of the at least one target signal line in the fan-out region and extending along the first direction. The width W of each target signal line is determined according to the method described in any of the previous embodiments.

In some embodiments, a number of the target signal lines is N, N is a positive integer greater than or equal to 2, the N target signal lines have N widths, a width of the target signal line with the maximum voltage drop among the N target signal lines is a maximum among the N widths.

In some embodiments, the wiring substrate further comprises bonding electrodes in the fan-out region, each target signal line is electrically connected to at least two bonding electrodes.

In some embodiments, the target signal line comprises at least one of a driving voltage signal line, a common voltage signal line, or a power supply voltage signal line.

According to yet another aspect of the present disclosure, there is provided a light-emitting substrate comprising the wiring substrate described in any of the previous embodiments. The base substrate further comprises a functional region comprising a plurality of partitions arranged in an array; a plurality of light-emitting elements in the plurality of partitions in the functional region; and a circuit board in the fan-out region.

In some embodiments, the plurality of partitions are in multiple rows and columns, a number of the target signal lines is N, N is a positive integer greater than or equal to 2, the N target signal lines are also in the functional region along the second direction, and the N target signal lines are in a same column of partitions or in M adjacent columns of partitions, M is a positive integer greater than or equal to 2.

In some embodiments, the circuit board comprises a chip on film, and the N target signal lines are electrically connected to a same circuit board via the bonding electrodes.

In some embodiments, each of the plurality of light-emitting elements comprises a Mini light-emitting diode.

According to still another aspect of the present disclosure, there is provided a display device comprising the wiring substrate described in any of the previous embodiments or the light-emitting substrate described in any of the previous embodiments.

BRIEF DESCRIPTION OF THE DRAWINGS

In order to more clearly describe the technical solutions in the embodiments of the present disclosure, the accompanying drawings used in the embodiments will be briefly described. Obviously, the accompanying drawings in the following description are only some embodiments of the present disclosure. Those of ordinary skill in the art can also obtain other drawings based on these drawings without undue experimentation.

FIG. 2 illustrates a flowchart of a method of allocating widths for target signal lines according to an embodiment of the present disclosure;

4

Figure 6:
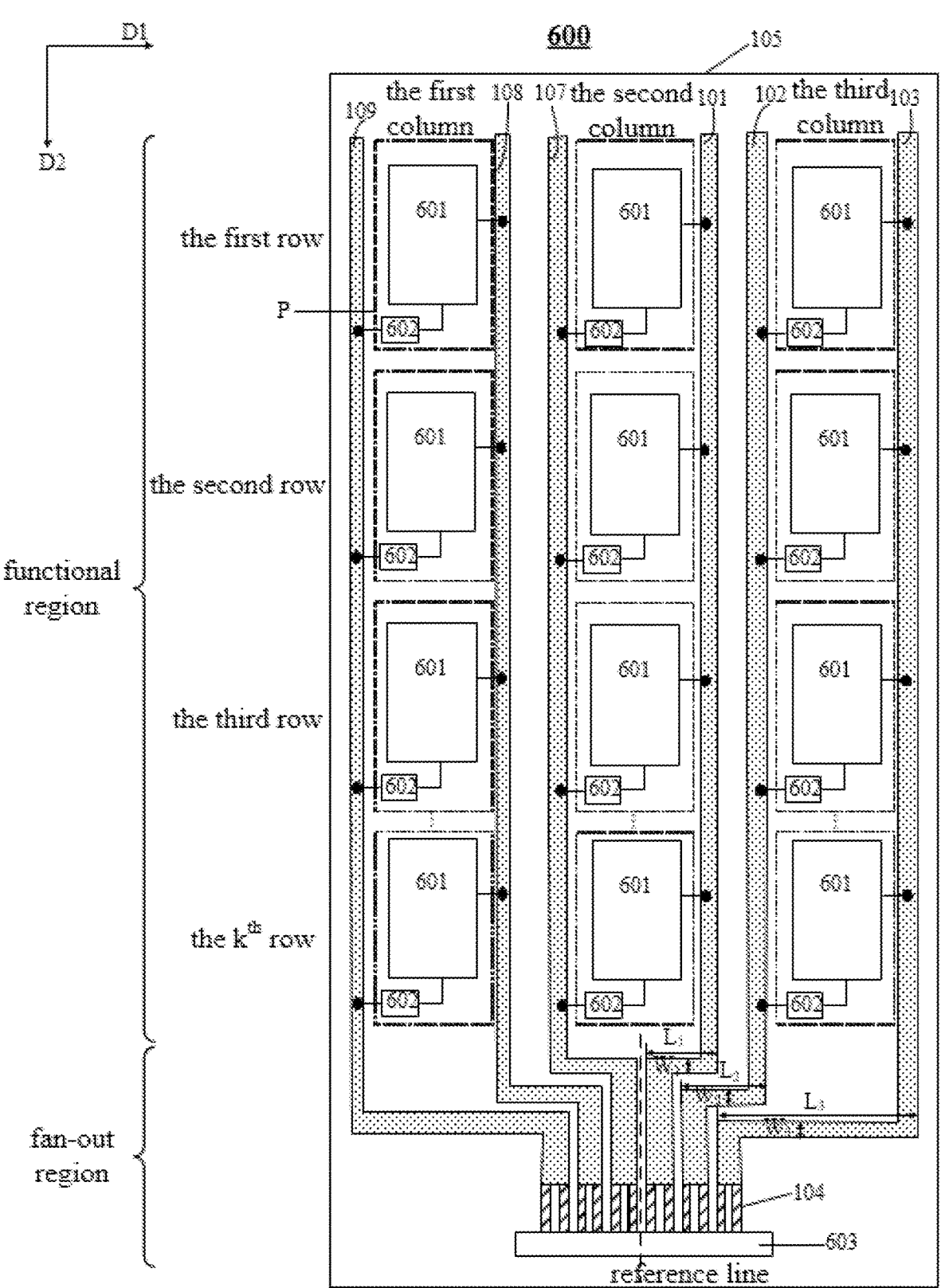
Figure 7:
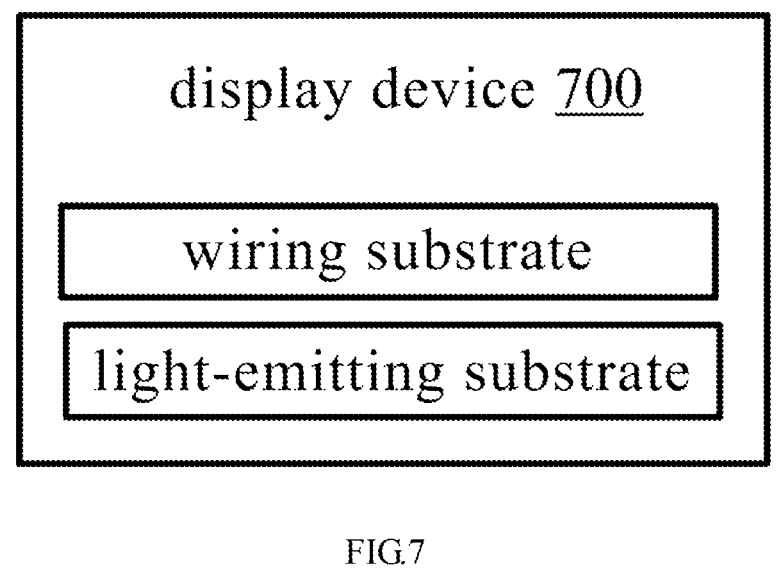

FIG. 6 illustrates a schematic plan view of a portion of a light-emitting substrate according to an embodiment of the present disclosure; and FIG. 7 illustrates a block diagram of a display device according to an embodiment of the present disclosure.

DETAILED DESCRIPTION OF THE DISCLOSURE

The technical solutions in the embodiments of the present disclosure will be clearly described in the following with reference to the drawings. Apparently, the described embodiments are only some, not all, of the embodiments of the present disclosure. Based on the embodiments in the present disclosure, all other embodiments obtained by those of ordinary skill in the art without undue experimentation belong to the protection scope of the present disclosure.

A plurality of signal lines are usually arranged on the wiring substrate for transmitting signals, such as electrical signals. Since each signal line has resistance, a voltage drop occurs between two ends of the signal line when an electrical signal is transmitted in the signal line. In order to ensure that the voltage drop between the two ends of the signal line does not exceed a safety threshold, there are requirements on the value of the resistance of the signal line. In the related art, increasing the width of the signal line can reduce the resistance of the signal lines, however, due to the limitation of the size of the wiring substrate and there must be an interval between adjacent signal lines to avoid signal cross-talk caused by the close distance between adjacent signal lines, there is an upper limit on the width of the signal line. Therefore, it is usually chosen to increase the cross-sectional area of the signal line by increasing the thickness of the signal line, thereby reducing the resistance of the signal line. Multiple signal lines on the same layer can be formed simultaneously through patterning in the same process, and the thickness of multiple signal lines on the same layer is limited by the signal line that requires the greatest thickness.

The wiring substrate comprises a functional region and a fan-out region. The functional region comprises multiple partitions arranged in an array. The fan-out region may be arranged with structures such as bonding electrodes and circuit boards. Each signal line receives the electrical signal provided by the circuit board through the bonding electrodes in the fan-out region, and extends to the functional region to transmit the corresponding electrical signal to each partition. In order to meet the product requirements of narrow frame or even no frame, the fan-out region of the wiring substrate usually has a smaller size along the extending direction of the signal lines, however, the plurality of signal lines gather in the fan-out region, thus the plurality of signal lines change from a state that a large interval is between adjacent signal lines to a state that a substantially consistent and small interval is between adjacent signal lines. Therefore, compared with the portion of the signal line in the functional region, the portion of the signal line in the fan-out region is more restrictive in terms of dimensional parameters related to voltage drop, such as line width and line length, so the portion of the signal line in the fan-out region often becomes the cause that the thickness of the conductive layer has to be increased. However, the thickened conductive layer imposes more stringent requirements on the process, which often leads to a decrease in product yield and an increase on production cost.

Figure 1:
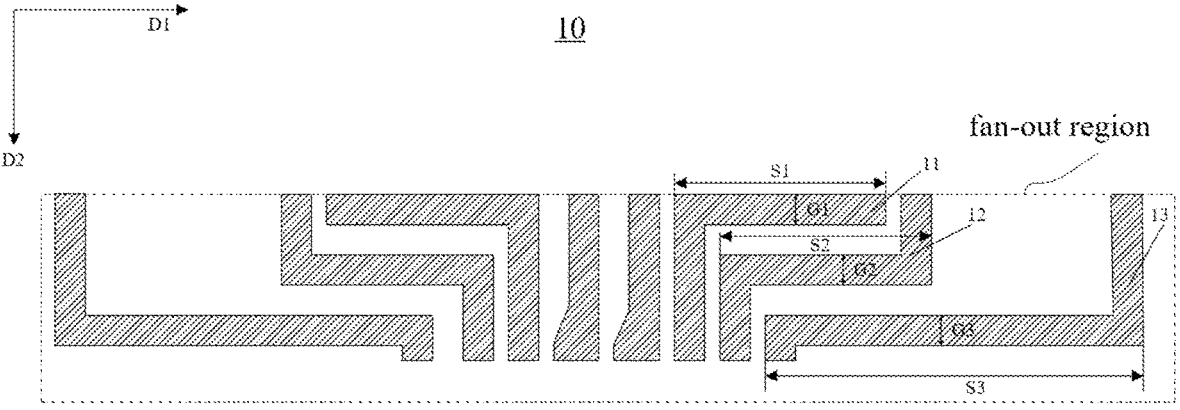
FIG. 1 illustrates the arrangement of signal lines in the fan-out region in the related art.

FIG. 1 illustrates a schematic diagram of the arrangement of signal lines of a wiring substrate 10 in a fan-out region in the related art. As illustrated in FIG. 1, the fan-out region comprises a plurality of signal lines, such as a signal line 11, a signal line 12, and a signal line 13. In the fan-out region, a portion of the signal line 11 along a first direction D1 has a size S1 along the first direction D1 and has a size G1 along a second direction D2, and the second direction D2 inter- sects with the first direction D1. A portion of the signal line 12 along the first direction D1 has a size S2 along the first direction D1 and has a size G2 along the second direction D2. A portion of the signal line 13 along the first direction D1 has a size S3 along the first direction D1 and has a size G3 along the second direction D2. The sizes of S1 and S2 are much smaller than the size S3, but sizes G1, G2, G3 are substantially equal. This causes the voltage drop of the signal line 13 to be much larger than the voltage drop of the signal line 11 and the signal line 12, and the voltage drop of the signal line 13 exceeds the safety threshold, so that the overall voltage drop level of the wiring substrate 10 is limited by the voltage drop of the signal line 13. As a result, the wiring substrate 10 has poor electrical performance.

In order to solve the technical problems in the related art, embodiments of the present disclosure provide a method of allocating widths for target signal lines, and FIG. 2 illus- trates a flow chart of the method 100. Referring to FIG. 2, the method 100 comprises:

Step S101: numbering at least one target signal line respectively.

Step S102: performing steps S103-S107 at least once until the number of target signal lines to be allocated widths in the set is zero.

Step S103: determining the set of target signal lines to be allocated widths.

Step S104: determining a planar region R based on conditions satisfied by a voltage drop V and a temperature rise T of each of the target signal lines to be allocated widths and widths W of the target signal lines to be allocated widths, the voltage drop V being a function V (L, W) of a length L and a width W, the length L referring to a length of a sub-portion along a first direction, the width W referring to a width of the sub-portion along a second direction inter- secting with the first direction, the sub-portion being a portion of each target signal line in a fan-out region and extending along the first direction.

Step S105: determining a number i of a target signal line with the maximum voltage drop among the target signal lines to be allocated widths in the set.

Step S106: substituting a known length $L_i$ of the target signal line numbered i into V (L, W) to obtain V ($L_i$, W), obtaining a $W_i$ based on an intersection of V ($L_i$, W) and a boundary of the planar region R, the $W_i$ being the width of the sub-portion of the target signal line numbered i along the second direction, the sub-portion of the target signal line numbered i being the portion of the target signal line numbered i in the fan-out region and extending along the first direction.

Step S107: removing the target signal line that has been allocated width $W_i$ from the set.

It should be noted that the term "voltage drop" refers to voltage or potential difference. When the current flows through the target signal line, a certain voltage drop will be generated in each section of the target signal line. The voltage drop is the potential difference caused by the charge moving from one end of a section of the signal line to the other end of a section of the signal line. The term "tempera- ture rise" refers to the increase in temperature of the target signal line when it operates with a non-zero fixed electric power for a period of time compared with the temperature at zero electric power.

In addition, it should be noted that the term "fan-out region" refers to the region used to connect the signal lines to the circuit board. The fan-out region is usually arranged with structures such as signal lines, bonding electrodes, and circuit boards. For example, the portion of the signal line in the fan-out region is connected to the circuit board through the bonding electrodes, so as to receive signals from the circuit board.

It should be pointed out that the term "to be allocated width" refers to the line width of a sub-portion of the target signal line that is in the fan-out region and extends along the first direction. The term "planar region R" is a two-dimen- sional planar region defined by L and W, and the planar region R can be understood as a mathematical set composed of L and W.

With the method 100, after performance of steps S101- S107 every time, a width can be allocated to the sub-portion of the target signal line with the maximum voltage drop in the set that is in the fan-out region and extends along the first direction, until the sub-portion of each target signal line in the set that is in the fan-out region and extends along the first direction is allocated to width. Compared with the related art that the sub-portions of signal lines in the fan-out region and extending along the first direction have different lengths but substantially the same width, in the method 100 provided by the embodiments of the present disclosure, the width allo- cated to the sub-portion of each target signal line in the fan-out region and extending along the first direction is associated with the length, voltage drop, temperature rise, etc. of the sub-portion of the target signal line in the fan-out region and extending along the first direction. Therefore, the dynamic allocation of the width of each target signal line is realized. In addition, the width is dynamically allocated to each target signal line by using the method 100, so that the voltage drop of all target signal lines, especially the maxi- mum voltage drop, is less than the voltage drop threshold, and the voltage drop of all target signal lines is smaller than the voltage drop of the signal line 13 of the wiring substrate 10, so as to improve the overall voltage drop level of the wiring substrate.

Figure 3:
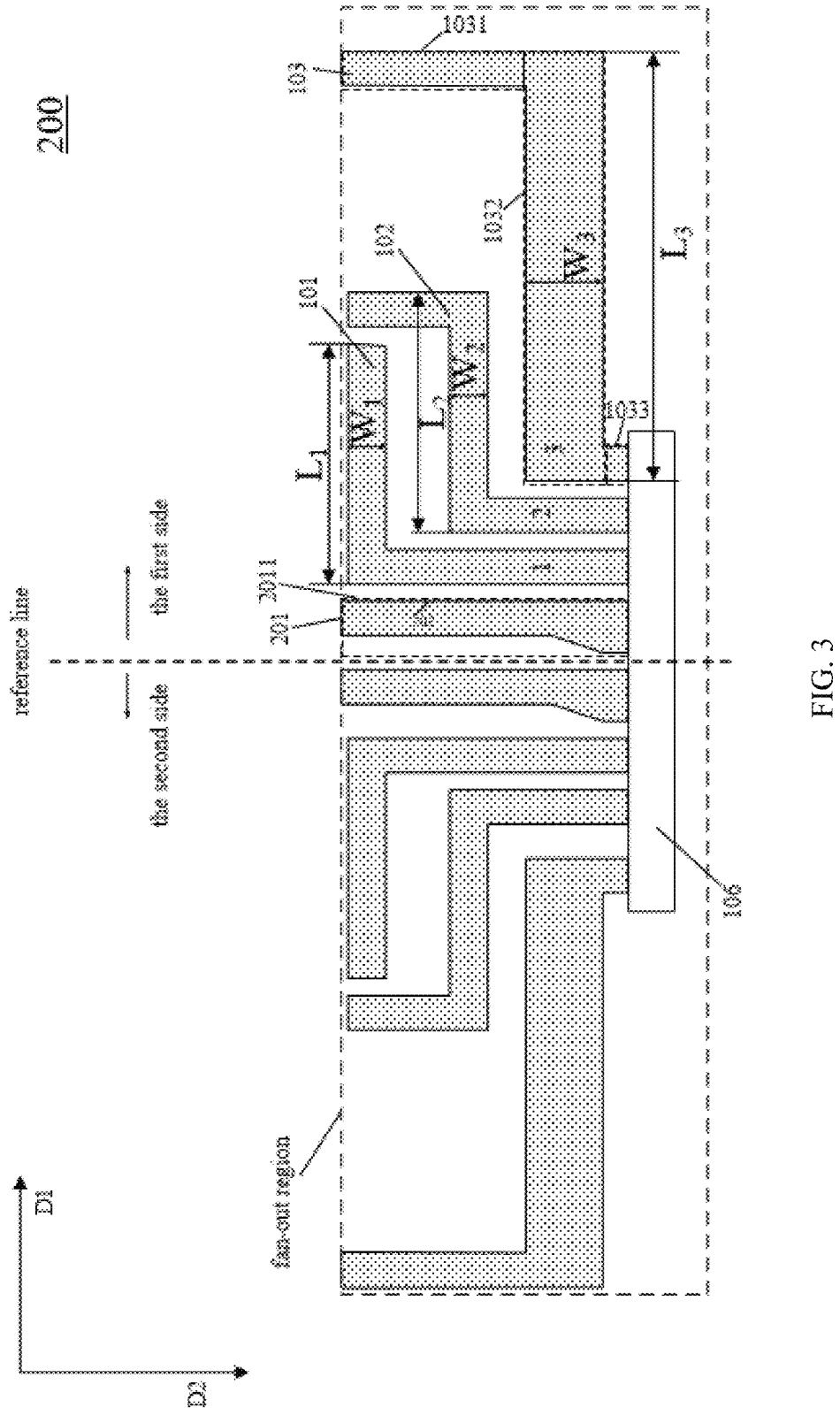
FIG. 3 illustrates an arrangement of target signal lines in a fan-out region according to an embodiment of the present disclosure.
Figure 4:
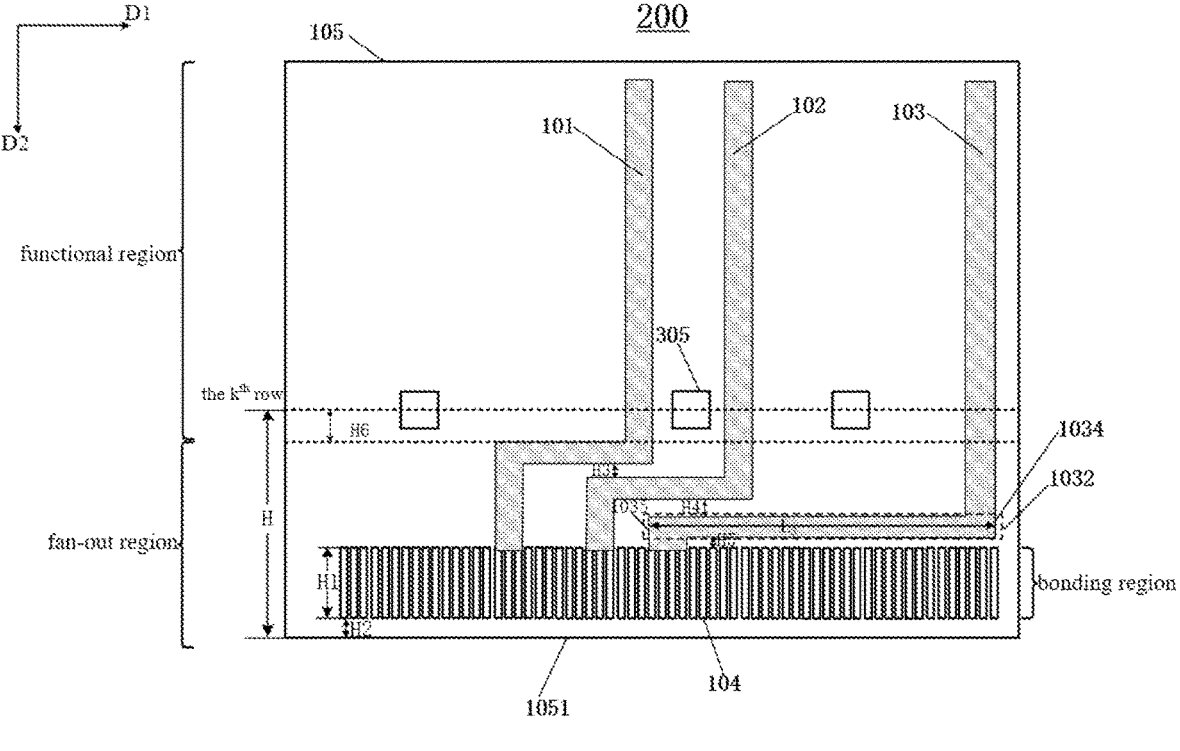
FIG. 4 illustrates a schematic plan view of a portion of a wiring substrate according to an embodiment of the present disclosure.

FIG. 3 illustrates a schematic layout of some signal lines of the wiring substrate 200 in the fan-out region according to an embodiment of the present disclosure, and FIG. 4 illustrates a partial plan view of the wiring substrate 200. The steps of the method 100 are described in detail below with reference to FIG. 2 to FIG. 4.

Step S101: numbering at least one target signal line respectively.

The fan-out region of the wiring substrate 200 is usually provided with a plurality of signal lines. Among these multiple signal lines, some of the signal lines have low requirements on the resistance of the signal lines due to the transmission of digital signals, and the size design of such signal lines in the fan-out region is not within the discussion scope of the embodiments of the present disclosure, that is, they are "non-target signal lines". The others of the signal lines among the plurality of signal lines transmit electrical signals with constant amplitude, such as constant voltage signals or constant current signals, and the design of their size parameters has a significant impact on the overall voltage drop level of the wiring substrate 200, the widths of these signal lines in the fan-out region are within the discussion scope of the embodiments of the present disclo- sure, and these signal lines refer to "target signal lines" herein.

In other words, the target signal line refers to a signal line that transmits an electrical signal of constant amplitude and comprises a plurality of sub-portions which are sequentially connected in the fan-out region. Among the multiple sub-portions of the target signal line, only one sub-portion extends along the first direction D1, and at most two sub-portions extend along the second direction D2. One end of the sub-portion extending along the second direction D2 communicates with one end of the sub-portion extending along the first direction D1 to form an integrated structure, and the other end of the sub-portion extending along the second direction D2 is connected to at least one bonding electrode of the bonding region. Specifically, referring to the signal line 103 in FIG. 3, the signal line 103 transmits a voltage signal of constant amplitude, and comprises three sub-portions 1031, 1032, 1033 sequentially connected in the fan-out region. Only one sub-portion 1032 of the three sub-portions 1031, 1032, 1033 extends along the first direction D1, two sub-portions 1031 and 1033 of the three sub-portions 1031, 1032, 1033 extend along the second direction D2, the sub-portions 1031 and 1033 communicate with two ends of the sub-portions 1032 respectively to form an integrated structure. Therefore, the signal line 103 is the target signal line, and similarly, the signal lines 101 and 102 are also target signal lines. In addition, it should be pointed out that, in the fan-out region, the signal line that only has sub-portion extending along the second direction D2 is the non-target signal line.

The signal line or the sub-portion of the signal line extending in a direction means that the signal line or the sub-portion of the signal line has a roughly strip-like structure, and the extending direction of the longest side of the sides of the strip-like structure is parallel to the direction. The extending direction of the signal line or the sub-portion of the signal line may be regarded as being parallel to the extending direction of the side with the largest length of strip-like structure.

Specifically, referring to the signal line 201 in FIG. 3, the sub-portion 2011 of the signal line 201 in the fan-out region and extending along the second direction has a substantially strip-like structure. The side 202 with the largest length of the strip-like structure only extends along the second direction D2, so the sub-portion 2011 of the signal line 201 in the fan-out region and extending along the second direction can be considered to only extend along the second direction D2. Therefore, the signal line 201 is not the target signal line referred to herein, but a non-target signal line.

FIG. 3 illustrates 8 signal lines as an example, and these 8 signal lines comprise target signal lines 101, 102, 103 and other non-target signal lines. These 8 signal lines are electrically connected to the same circuit board 106 (such as a chip on film) in the bonding region. The circuit board 106 comprises a plurality of gold finger structures, and the gold finger structures are in one-to-one correspondence with and electrically connected to the plurality of bonding electrodes in the bonding region. As illustrated in FIG. 3, taking the centerline of the circuit board 106 parallel to the second direction D2 as a reference line, the target signal lines (comprising the target signal lines 101, 102, 103) on the first side of the reference line are electrically connected to the circuit board 106 on the first side of the reference line, and the signal lines on the second side of the reference line are electrically connected to the circuit board 106 on the second side of the reference line. In some embodiments, since the orthographic projections of the plurality of target signal lines on one side of the reference line on a plane parallel to the first direction D1 overlap each other, and the plurality of target signal lines on one side of the reference line are spaced apart from each other, so the width of the fan-out region along the second direction D2 is positively correlated with the sum of the widths of the target signal lines on either side of the reference line. Since the width of the fan-out region along the second direction D2 is positively correlated with the sum of the widths of the target signal lines on either side of the reference line, a set of target signal lines in the method 100 refers to a set of target signal lines on one side of the reference line. For example, in the embodiment of FIG. 3, the set of target signal lines is the set of target signal lines 101, 102, 103 on the first side of the reference line. Numbering the three target signal lines 101, 102, and 103 respectively, for example, the number of the target signal line 101 may be 1, the number of the target signal line 102 may be 2, and the number of the target signal line 103 may be 3. In some embodiments, the target signal lines 101 and 103 may be driving voltage signal lines VLED configured to transmit a first constant voltage signal, the target signal line 102 may be a common voltage signal line GND configured to transmit a second constant voltage signal.

Step S102: performing the steps S103-S107 at least once until the number of target signal lines to be allocated widths in the set is 0.

The times of performing steps S103-S107 are equal to the number of target signal lines. In the embodiment of FIG. 3, the number of target signal lines is 3, therefore, the times of performing steps S103-S107 are 3, so that finally, the number of target signal lines to be allocated widths in the set is 0. In other words, by repeatedly performing steps S103-S107 three times, a corresponding width can be allocated to each of the three target signal lines 101, 102, 103 finally. As explained above, the term "to be allocated width" refers to the line width of a sub-portion of the target signal line in the fan-out region and extending along the first direction D1. For example, in FIG. 3, the width to be allocated of the target signal line 103 refers to the line width of the sub-portion 1032 of the target signal line 103 in the fan-out region and extending along the first direction D1.

The corresponding operations when steps S103-S107 are performed each time are described below.

Performing the steps S103-S107 for the first time:

Step S103: determining the set of target signal lines to be allocated widths.

The set of target signal lines to be allocated widths is a set of target signal line 101, target signal line 102 and target signal line 103.

Step S104: determining the planar region R based on conditions satisfied by a voltage drop V and a temperature rise T of each of the target signal lines to be allocated widths and widths W of the target signal lines to be allocated widths, the voltage drop V being a function V (L, W) of a length L and a width W, the length L referring to a length of a sub-portion of each target signal line in the fan-out region along the first direction D1, and the width W referring to a width of the sub-portion of each target signal line in the fan-out region along the second direction D2 intersecting with the first direction D1.

The sub-portion of the target signal line 101 in the fan-out region has a length $L_1$ along the first direction D1 and a width $W_1$ to be allocated along the second direction D2, the second direction D2 intersects with the first direction D1, for example, the second direction D2 is perpendicular to the first direction D1. The sub-portion of the target signal line 102 in the fan-out region and extending along the first direction has a length $L_2$ along the first direction D1 and a width $W_2$ to be allocated along the second direction D2. The sub-portion of the target signal line 103 in the fan-out region and extending along the first direction has a length $L_3$ along the first direction D1 and a width $W_3$ to be allocated along the second direction D2. The lengths $L_1$, $L_2$, $L_3$ are known, the widths $W_1$, $W_2$, $W_3$ are unknown and are to be allocated. The lengths $L_1$, $L_2$, and $L_3$ may have various appropriate values, which are not specifically limited in embodiments of the present disclosure. In some embodiments, the length $L_1$ of the target signal line 101 is about 12882 μm, the length $L_2$ of the target signal line 102 is about 13010 μm, and the length $L_3$ of the target signal line 103 is about 23380 μm.

Referring to FIG. 4, it should be noted that, the known length $L_i$ (i=1, 2, 3) of the target signal line refers to the maximum length in the first direction D1 of the sub-portion of the target signal line in the fan-out region and extending along the first direction D1, a sub-portion of the target signal line in the fan-out region and extending along the first direction D1 is directly connected to a sub-portion of the target signal line closest to the bonding region and extending along the second direction D2, wherein the sub-portion of the target signal line closest to the bonding region and extending along the second direction D2 is in direct contact with and electrically connected to at least one corresponding bonding electrode 104, and the bonding electrode 104 extends along the second direction D2. Specifically, taking the target signal line 103 in FIG. 4 as an example, the length $L_3$ in the first direction D1 of the sub-portion of the target signal line 103 in the fan-out region and extending along the first direction refers to the distance between the first side 1034 and the second side 1035 of the sub-portion 1032 of the target signal line 103 in the fan-out region and extending along the first direction.

The voltage drop V is a function V (L, W) of the length L and the width W, and the temperature rise T is also a function T (L, W) of the length L and the width W. In some embodiments, the step of determining a planar region R based on conditions satisfied by a voltage drop V and a temperature rise T of each of the target signal lines to be allocated widths and widths W of the target signal lines to be allocated widths may comprise the following sub-step: determining the planar region R based on a set of inequalities consisting of the following inequalities: the voltage drop V (L, W) of each of the target signal lines 101, 102, 103 being less than a voltage drop threshold $V_{limit}$, the temperature rise T (L, W) of each of the target signal lines 101, 102, 103 being less than a temperature rise threshold $T_{limit}$, and a sum of the widths W of the target signal lines 101, 102, 103 being less than a dynamic width threshold $W_{allow1}$. The set of inequalities may be expressed as:

$$\begin{cases} T_i(L_i, W_i) - T_{limit} < 0 \\ V_i(L_i, W_i) - V_{limit} < 0 \\ \sum_{j=1}^{j=3} W_j < W_{allow1} \end{cases}.$$

It can be seen that the planar region R determined by the set of inequalities is a two-dimensional planar region defined by L and W, and the two-dimensional planar region is a region defined by L within a certain numerical range and W within a certain numerical range. In the set of inequalities, the value of i is 1, 2, or 3, and the value of j is 1, 2, or 3. $T_i$ ($L_i$, $W_i$) represents the temperature rise of the target signal line numbered i. For example, $T_1$ ($L_1$, $W_1$) represents the temperature rise of the target signal line numbered 1 (i.e. the target signal line 101), $T_2$ ($L_2$, $W_2$) represents the temperature rise of the target signal line numbered 2 (i.e. the target signal line 102), and $T_3$ ($L_3$, $W_3$) represents the temperature rise of the target signal line numbered 3 (i.e. the target signal line 103). Similarly, $V_1$ ($L_1$, $W_1$) represents the voltage drop of the target signal line numbered 1 (i.e. the target signal line 101), $V_2$ ($L_2$, $W_2$) represents the voltage drop of the target signal line numbered 2 (i.e. the target signal line 102), and $V_3$ ($L_3$, $W_3$) represents the voltage drop of the target signal line numbered 3 (i.e. the target signal line 103).

The temperature rise T (L, W) involves many electrical and thermal parameters, and its physical model is relatively complex. In some embodiments, the temperature rise T (L, W) of each target signal line satisfies the following formula: $T (L, W) = \{(1/(L*W*X)^Y)/(I/C)\}^{1/Q}$, where I is the current transmitted by each target signal line and its unit is mA, and X, Y, C, and Q are constants. The temperature rise threshold $T_{limit}$ represents the upper limit of the allowable temperature rise, and its value is related to factors such as structural thermal expansion and product specification requirements, and the value may be different in different projects. The temperature rise threshold $T_{limit}$ usually ranges from 10 to 20° ° C. In some embodiments, $T_{limit}$ is equal to 15° C.

In some embodiments, the voltage drop V (L, W) of each target signal line satisfies the following formula: V (L, W)=E+F*L/W, where E and F are constants. As illustrated in FIG. 4, the wiring substrate 200 also comprises a functional region. The functional region comprises multiple partitions arranged in an array, and the multiple partitions are arranged in multiple rows and multiple columns, and a light-emitting element and a driving circuit electrically connected to the light-emitting element may be arranged in each partition. Each of the target signal lines 101, 102, 103 is arranged in the functional region and the fan-out region, and in the functional region, at least one of the target signal lines 101, 102, 103 is arranged in each column of the partitions. Further, the voltage drop V (L, W) of each target signal line may satisfy the following formula:

$$V(L, W) = R_{pixel} * \sum\nolimits_{j=1}^{j=k} I_j + R(L, W) * I_k,$$

R (L, W) is the resistance of the portion of the target signal line in the fan-out region. In some embodiments, R (L, W)=$R_s$*L/W, $I_j$=j*$I_0$, $I_k$=k*$I_0$. R (L, W)=$R_s$*L/W, $I_j$=j*$I_0$, and $I_k$=k*$I_0$ are substitute into V (L, W), and V (L, W)=k* (k+1)/2*$I_0$*$R_{pixel}$+k*$I_0$*$R_s$*L/W is obtained. $R_{pixel}$ represents the resistance of the section corresponding to a single partition of each target signal line, k is the number of rows of the partitions, $I_0$ is the current flowing through a single partition during operation, $R_s$ is the square resistance of each target signal line and is the measured value. The wiring substrate 200 comprises k rows of partitions, and the portion of each target signal line in the functional region extends from the first row of partitions to the $k^{th}$ row of partitions along the second direction D2. Therefore, the portion of each target signal line in the functional region may be divided into k sections according to the size of a single section along the second direction D2, the section corresponding to the first row of partitions is the first section, and the section corresponding to the $k^{th}$ row of partitions is the $k^{th}$ section. The current transmitted on each section is $I_0$, and the sections are connected in parallel with each other. Therefore, $I_j$ represents the sum of the currents transmitted on the first section to the $j^{th}$ section of each target signal line. When the model of the wiring substrate 200 has been determined, $R_{pixel}$, k, $I_0$, and $R_s$ can all be regarded as constants. In this case, E=k*(k+1)/2*$I_0$*$R_{pixel}$, F=k*$I_0$*$R_s$.

The voltage drop threshold $V_{limit}$ indicates the upper limit of the allowable voltage drop, which is related to the amplitude and use of the signal transmitted by the target signal line, different target signal lines may have different $V_{limit}$. For example, $Vl_{limit}$ of the driving voltage signal line VLED and the common voltage signal line GND is generally about 0.5 mV. In some embodiments, $V_{limit}$ is equal to 0.45 mV.

In the inequality $$\sum_{j=1}^{j=3} W_j < W_{allow1},$$

the dynamic width threshold $W_{allow1}$ represents the threshold of the sum of the total widths that can be allocated to the three target signal lines 101, 102, 103, and the threshold needs to be greater than $W_1+W_2+W_3$. The value of $W_{allow1}$ is related to factors such as the frame size of the wiring substrate 200, the distance between the light-emitting element and the fan-out region, and the minimum distance between target signal lines. Referring to FIG. 4, $W_{allow1}$=H− H1−H2−(H3+H4+H5)−H6, where H represents the distance between the center of the light-emitting element 305 closest to the bonding region in the last row (i.e. the $k^{th}$ row) of partitions of the wiring substrate 200 and the side 1051 of the base substrate 105, H1 represents the length of the bonding electrode 104 along the second direction D2, H2 represents the distance between the first end of the bonding electrode 104 close to the side 1051 and the side 1051, H3 represents the distance between the sub-portion of the target signal line 101 in the fan-out region and extending along the first direction D1 and the sub-portion of the adjacent target signal line 102 in the fan-out region and extending along the first direction D1, H4 represents the distance between the sub-portion of the target signal line 102 in the fan-out region and extending along the first direction D1 and the sub-portion of the adjacent target signal line 103 in the fan-out region and extending along the first direction D1, H5 represents the distance between the sub-portion of the target signal line 103 in the fan-out region and extending along the first direction D1 and the second end of the bonding electrode 104 opposite to the first end, and H6 represents the distance between the center of the light-emitting element 305 in the $k^{th}$ row of partitions of the wiring substrate 200 and the boundary of the fan-out region. By setting the distance H3 between the adjacent target signal lines 101 and 102 and the distance H4 between the adjacent target signal lines 102 and 103, crosstalk between the signals of the target signal lines can be avoided. In addition, by setting the distance H6 between the center of the light-emitting element 305 in the $k^{th}$ row of partitions and the boundary of the fan-out region, crosstalk between the signal of the target signal line in the fan-out region and the signal of the light-emitting element 305 can be avoided. The value of $W_{allow1}$ can be flexibly changed according to product design requirements, which is not specifically limited in the embodiments of the present disclosure. In an example, $W_{allow1}$ is equal to 2.8 mm.

Step S105: determining the number i of a target signal line with the maximum voltage drop among the target signal lines to be allocated widths in the set.

Specifically, the step S105 may comprise the following sub-steps:

a: substituting $W_0$ into V (L, W) to obtain V (L, $W_0$), $W_0$ is associated with the dynamic width threshold $W_{allow1}$. In the embodiments of the present disclosure, $W_0$ may be reasonably selected according to the amplitude and use of the signal transmitted by the target signal line to be allocated width. Generally, $W_0$=$W_{allow1}$/N, N is the number of target signal lines to be allocated widths in the set, here, N=3. When $W_0$=$W_{allow1}$/N, V (L, $W_0$)=k* (k+1)/2*$I_0$*$R_{pixel}$+k*$I_0$*$R_s$*L*3/$W_{allow1}$.

b: substituting the known length of each of the target signal lines to be allocated widths in the set into V (L, $W_0$) respectively to obtain a set of different voltage drops.

As mentioned earlier, the length $L_1$ along the first direction D1 of the sub-portion of the target signal line 101 in the fan-out region and extending along the first direction, the length $L_2$ along the first direction D1 of the sub-portion of the target signal line 102 in the fan-out region and extending along the first direction, and the length $L_3$ along the first direction D1 of the sub-portion of the target signal line 103 in the fan-out region and extending along the first direction are known, the values of $L_1$, $L_2$ and $L_3$ can be determined according to the amplitude and use of the signal transmitted by the target signal line and the design requirements of the product. In this embodiment, $L_1$ is about 12882 μm, $L_2$ is about 13010 μm, and $L_3$ is about 23380 μm. Substituting the values of $L_1$, $L_2$ and $L_3$ into V (L, $W_0$) respectively, the following equalities are obtained:

$$V_1(L_1, W_0) = k*(k+1)/2*I_0*R_{pixel} + k*I_0*R_s*12882*3/W_{allow1},$$

$$V_2(L_2, W_0) = k*(k+1)/2*I_0*R_{pixel} + k*I_0*R_s*13010*3/W_{allow1},$$

$$V_3(L_3, W_0) = k*(k+1)/2*I_0*R_{pixel} + k*I_0*R_s*23380*3/W_{allow1}.$$

That is to say, the set comprises three different voltage drops, namely $V_1$ ($L_1$, $W_0$), $V_2$ ($L_2$, $W_0$), and $V_3$ ($L_3$, $W_0$).

c: selecting the maximum voltage drop from the set of different voltage drops.

By comparing $V_1$ ($L_1$, $W_0$), $V_2$ ($L_2$, $W_0$), and $V_3$ ($L_3$, $W_0$), it can be known that $V_3$ ($L_3$, $W_0$) is the maximum voltage drop.

d: determining the number i of the target signal line with the maximum voltage drop according to the known length corresponding to the maximum voltage drop.

The known length corresponding to $V_3$ ($L_3$, $W_0$) is $L_3$. Since numbers have been pre-numbered to each target signal line in step S101 and the length of the portion of each target signal line with the corresponding number in the fan-out region is known, it can be known that the number of the corresponding target signal line is 3 according to the known length $L_3$, that is, the target signal line with the maximum voltage drop is the target signal line 103 with the number 3.

Step S106: substituting the known length $L_3$ of the target signal line numbered 3 into V (L, W) to obtain V ($L_3$, W), that is, V ($L_3$, W)=k*(k+1)/2*$I_0$*$R_{pixel}$+k*$I_0$*$R_s$*23380/W, and obtaining a $W_3$ based on an intersection of V ($L_3$, W) and a boundary of the planar region R. $W_3$ is the width along the second direction D2 of the sub-portion of the target signal line 103 numbered 3 in the fan-out region. In this embodiment, $W_3$ is equal to 1036 μm.

Step S107: removing the target signal line 103 that has been allocated width $W_3$ from the set.

By performing steps S103-S107 for the first time, the width $W_3$ can be dynamically allocated to the target signal line 103 having the maximum voltage drop among the three target signal lines, so that the allocated width $W_3$ is equal to 1036 μm.

Performing the steps S103-S107 for the second time:

Step S103: determining a set of target signal lines to be allocated widths. Since the target signal line 103 with the allocated width $W_3$ has been removed from the set when step S107 is performed for the first time, the updated set comprises the target signal line 101 and the target signal line 102 in this step S103.

Step S104: determining the updated planar region R' based on the following set of inequalities:

$$\begin{cases} T_i(L_i, W_i) - T_{limit} < 0 \\ V_i(L_i, W_i) - V_{limit} < 0 \\ \sum_{j=1}^{j=2} W_j < W_{allow2} \end{cases}.$$

Compared with the values of i, j and $W_{allow1}$ when step S104 is performed for the first time, when step S104 is performed this time, the value of i is 1 or 2, the value of j is 1 or 2, $W_{allow2}=W_{allow1}-W_1$, and the values of other parameters remain unchanged. Since the dynamic width threshold $W_{allow2}$ has changed compared with the dynamic width threshold $W_{allow1}$, the updated planar region R' determined through step S104 this time is also changed compared with the planar region R determined through step S104 last time. Correspondingly, the horizontal and vertical coordinate values (L and W) corresponding to the boundary of the updated planar region R' determined in step S104 this time are also changed compared with the horizontal and vertical coordinate values corresponding to the boundary of the planar region R determined in step S104 last time.

Step S105: determining the number i of the target signal line with the maximum voltage drop among the target signal line 101 and the target signal line 102.

Specifically, the step S105 may comprise the following sub-steps:

a: substituting $W_0'$ into V (L, W) to obtain V (L, $W_0'$), $W_0'$ is associated with the dynamic width threshold $W_{allow2}$, $W_0'=W_{allow2}/(N-1)$, that is, $W_0'=W_{allow2}/2$. Substituting $W_0'=W_{allow2}/2$ into V (L, W), V (L, $W_0'$)=k*(k+1)/2*$I_0$*$R_{pixel}$+k*$I_0$*$R_s$*L*2/$W_{allow2}$ is obtained.

b: substituting the known length $L_1$ of the target signal line 101 and the known length $L_2$ of the target signal line 102 into V (L, $W_0'$) respectively to obtain a set of different voltage drops. $L_1$ is about 12882 μm, and $L_2$ is about 13010 μm. Substituting the values of $L_1$ and $L_2$ into V (L, $W_0'$) respectively, the following equalities are obtained:

$$V_1(L_1, W_0') = k*(k+1)/2*I_0*R_{pixel} + k*I_0*R_s*12882*2/W_{allow2},$$

$$V_2(L_2, W_0') = k*(k+1)/2*I_0*R_{pixel} + k*I_0*R_s*13010*2/W_{allow2}.$$

That is to say, the set comprises two different voltage drops, namely $V_1$ ($L_1$, $W_0'$) and $V_2$ ($L_2$, $W_0'$).

c: by comparing $V_1$ ($L_1$, $W_0'$) and $V_2$ ($L_2$, $W_0'$), it can be known that $V_2$ ($L_2$, $W_0'$) has the maximum voltage drop.

d: according to the known length $L_2$ corresponding to the maximum voltage drop $V_2$ ($L_2$, $W_0'$), the number of the target signal line with the maximum voltage drop is determined as 2. That is, the target signal line 102 numbered 2 has the maximum voltage drop among the target signal line 101 and the target signal line 102.

Step S106: substituting the known length $L_2$ of the target signal line 102 numbered 2 into V (L, W) to obtain $V_2$ ($L_2$, W), that is, $V_2$ ($L_2$, W)=k*(k+1)/2*$I_0$*$R_{pixel}$+ k*$I_0$*$R_s$*13010/W, and obtaining $W_2$ based on the intersection of $V_2$ ($L_2$, W) and the boundary of the updated planar region R'. $W_2$ is the width along the second direction D2 of the sub-portion of the target signal line 102 numbered 2 in the fan-out region and extending along the first direction. In this embodiment, $W_2$ is equal to 710 μm.

Step S107: removing the target signal line 102 that has been allocated width $W_2$ from the set.

By performing steps S103-S107 for the second time, the width $W_2$ can be dynamically allocated to the target signal line 102 with the maximum voltage drop among the remaining two target signal lines 101 and 102 in the set, so that the allocated width $W_2$ is equal to 710 μm.

Performing the steps S103-S107 for the third time:

Step S103: determining a set of target signal lines to be allocated widths. Since the target signal line 102 with the allocated width $W_2$ has been removed from the set when step S107 is executed for the second time, in step S103 this time, the updated set only comprises the target signal line 101.

Step S104: determining the updated planar region R" based on the following set of inequalities:

$$\begin{cases} T_1(L_1, W_1) - T_{limit} < 0 \\ V_1(L_1, W_1) - V_{limit} < 0 \\ W_1 < W_{allow3} \end{cases}.$$

Compared with the values of i, j and $W_{allow1}$ when step S104 is performed for the first time, when step S104 is performed this time, the value of i is 1, the value of j is 1, $W_{allow3}=W_{allow1}-W_1-W_2$, the values of other parameters remain unchanged. Since the dynamic width threshold $W_{allow3}$ has changed compared to the dynamic width thresholds $W_{allow1}$ and $W_{allow2}$, the updated planar region R" determined through step S104 this time is also changed compared to the planar region R determined through step S104 for the first time and the planar region R' determined through step S104 for the second time. Correspondingly, the horizontal and vertical coordinate values (L and W) corresponding to the boundary of the updated planar region R" determined in step S104 this time are also changed compared with the horizontal and vertical coordinate values corresponding to the boundaries of the planar region R determined through step S104 for the first time and the planar region R' determined through step S104 for the second time. It can be seen that the dynamic width threshold is a dynamic value associated with the performance times of the method 100 (or the number of target signal lines), rather than a constant. When performing steps S103-S107 for the first time, $W_{allow1}$ is equal to the initial value of 2.8 mm. When performing steps S103-S107 for the second time, $W_{allow2}=W_{allow1}-W_1$. When performing steps S103-S107 for the third time, $W_{allow3}=W_{allow1}-W_1-W_2$. By analogy, $$W_{allown} = W_{allow1} - \sum_{j=1}^{j=n-1} W_j,$$

where n is a positive integer greater than or equal to 1 and less than or equal to N, N is the number of target signal lines, and $W_{allown}$ is the dynamic width threshold when step S104 is performed for the $n^{th}$ time.

Step S105: determining the number i of the target signal line 101.

Specifically, the step S105 may comprise the following sub-steps:

a: substituting $W_0''$ into V (L, W) to obtain V (L, $W_0''$). $W_0''$ is associated with the dynamic width threshold $W_{allow3}$, $W_0''=W_{allow3}/(N-2)$, i.e. $W_0''=W_{allow3}$. Substituting $W_0''=W_{allow3}$ into V (L, W), V (L, $W_0''$)=k* (k+1)/2*$I_0$*$R_{pixel}$+k*$I_0$*$R_s$*L/$W_{allow3}$ is obtained.

b: substituting the known length $L_1$ of the target signal line 101 into V (L, $W_0''$) to obtain a set of voltage drop, $L_1$ being about 12882 μm. Substituting the value of $L_1$ into V (L, $W_0''$), $V_1$ ($L_1$, $W_0''$)=k*(k+1)/2*$I_0$*$R_{pixel}$+ k*$I_0$*$R_s$*12882/$W_{allow3}$ can be obtained. That is, only one voltage drop $V_1$ ($L_1$, $W_0'''$) is comprised in the set.

d: determining the number of the target signal line as 1 according to the known length $L_1$ corresponding to the voltage drop $V_1$ ($L_1$, $W_0''$), that is, the target signal line to be allocated width is the target signal line 101 with number 1.

Step S106: substituting the known length $L_1$ of the target signal line 101 numbered 1 into V (L, W) to obtain $V_1$ ($L_1$, W), that is, V ($L_1$, W)=k*(k+1)/2*$I_0$*$R_{pixel}$+k*$I_0$*$R_s$*12882/ W, and obtaining $W_1$ based on the intersection of $V_1$ ($L_1$, W) and the boundary of the updated planar region R''. $W_1$ is the width along the second direction D2 of the sub-portion of the target signal line 101 numbered 1 in the fan-out region and extending along the first direction. In this embodiment, $W_1$ is equal to 710 μm.

Step S107: removing the target signal line 101 that has been allocated width $W_1$ from the set.

By performing steps S103-S107 for the third time, the remaining target signal lines 101 in the set can be dynamically allocated with a width $W_1$, so that the allocated width $W_1$ is equal to 710 μm.

So far, the number of target signal lines to be allocated widths in the set becomes 0, and the step ends.

Referring to FIG. 1, in the related art, the width G1 in the second direction D2 of the portion of the signal line 11 in the fan-out region is equal to 810 μm, the width G2 in the second direction D2 of the portion of the signal line 12 in the fan-out region is equal to 810 μm, the width G3 in the second direction D2 of the portion of the signal line 13 in the fan-out region is equal to 836 μm, G1, G2 and G3 are substantially equal, and G1+G2+G3=2456 μm. The voltage drop of signal line 13 is far greater than the voltage drops of signal lines 11 and 12 and has exceeded the voltage drop threshold $V_{limit}$, the overall voltage drop level of the wiring substrate 10 is limited by the voltage drop of the signal line 13. However, the method 100 provided by the embodiments of the present disclosure dynamically allocates widths to the three target signal lines 101, 102 and 103 respectively, so that the width $W_3$ in the second direction D2 of the sub-portion of the target signal line 103 with the maximum voltage drop that is in the fan-out region and extends along the first direction is equal to 1036 μm, the width $W_2$ in the second direction D2 of the sub-portion of the target signal line 102 with an intermediate voltage drop that is in the fan-out region and extends along the first direction is equal to 710 μm, the width $W_3$ in the second direction D2 of the sub-portion of the target signal line 101 with the minimum voltage drop that is in the fan-out region and extends along the first direction is equal to 710 μm, $W_1$+$W_2$+$W_3$=2456 μm, which is the same as the sum of G1+G2+G3 in the related art. Compared with the related art, on the premise of not occupying more width of the fan-out region to widen the frame or not increasing the thickness of the target signal line, the widths of the sub-portions of the three target signal lines 101, 102, 103 in the fan-out region and extending along the first direction have different values according to their respective lengths and voltage drops, instead of having a uniform width. With the method 100, the width $W_3$ of the target signal line 103 with the maximum voltage drop is significantly increased, and the voltage drop of the target signal line 103 is significantly reduced compared with the signal line 13 in the related art and lower than the voltage drop threshold $V_{limit}$. In addition, it should be noted that, compared with the related art, although the voltage drops of the target signal line 101 and the target signal line 102 are slightly increased due to a slight increase in the width of the fan-out region, since the overall voltage drop level of the wiring substrate 200 is limited by the maximum voltage drop, and the voltage drop value of the target signal line 103 with the maximum voltage drop is lower than the voltage drop value of the signal line 13 in the related art and lower than the voltage drop threshold $V_{limit}$, the overall voltage drop level of the wiring substrate 200 is actually significantly improved.

In some embodiments, the width of the sub-portion of the target signal line in the fan-out region and extending along the first direction D1 is positively related to the distance between the sub-portion of the target signal line that is in the fan-out region, extends along the second direction D2 and is closest to the functional region and the reference line. In an alternative embodiment, at least two target signal lines among the multiple target signal lines on the same side of the reference line satisfy the following phenomenon: the distance between the position of a first target signal line of the at least two target signal lines at the junction of the functional region and the fan-out region and the reference line, is greater than the distance between the position of a second target signal line of the at least two target signal lines at the junction of the functional region and the fan-out region and the reference line, and the width of the sub-portion of the first target signal line in the fan-out region and extending along the first direction D1 is at least 1.5 times the width of the sub-portion of the second target signal line in the fan-out region and extending along the first direction D1, for example, it can be 1.8 times, 2 times, 3 times, 3.5 times and so on. Specifically, taking target signal lines 102 and 103 as an example, the distance between the position of the target signal line 103 at the junction of the functional region and the fan-out region and the reference line is greater than the distance between the position of the target signal line 102 at the junction of the functional region and the fan-out region and the reference line. The width $W_3$ of the sub-portion of the target signal line 103 in the fan-out region and extending along the first direction D1 is equal to 1036 μm, and the width $W_2$ of the sub-portion of the target signal line 102 in the fan-out region and extending along the first direction D1 is equal to 710 μm, $W_3$ is about 1.5 times that of $W_2$.

FIG. 3 and FIG. 4 describe the steps of the method 100 by taking the number N of target signal lines equal to 3 as an example. However, as mentioned above, the number N of target signal lines may be any appropriate value, which is not specifically limited in the embodiments of the present disclosure.

Figure 5:
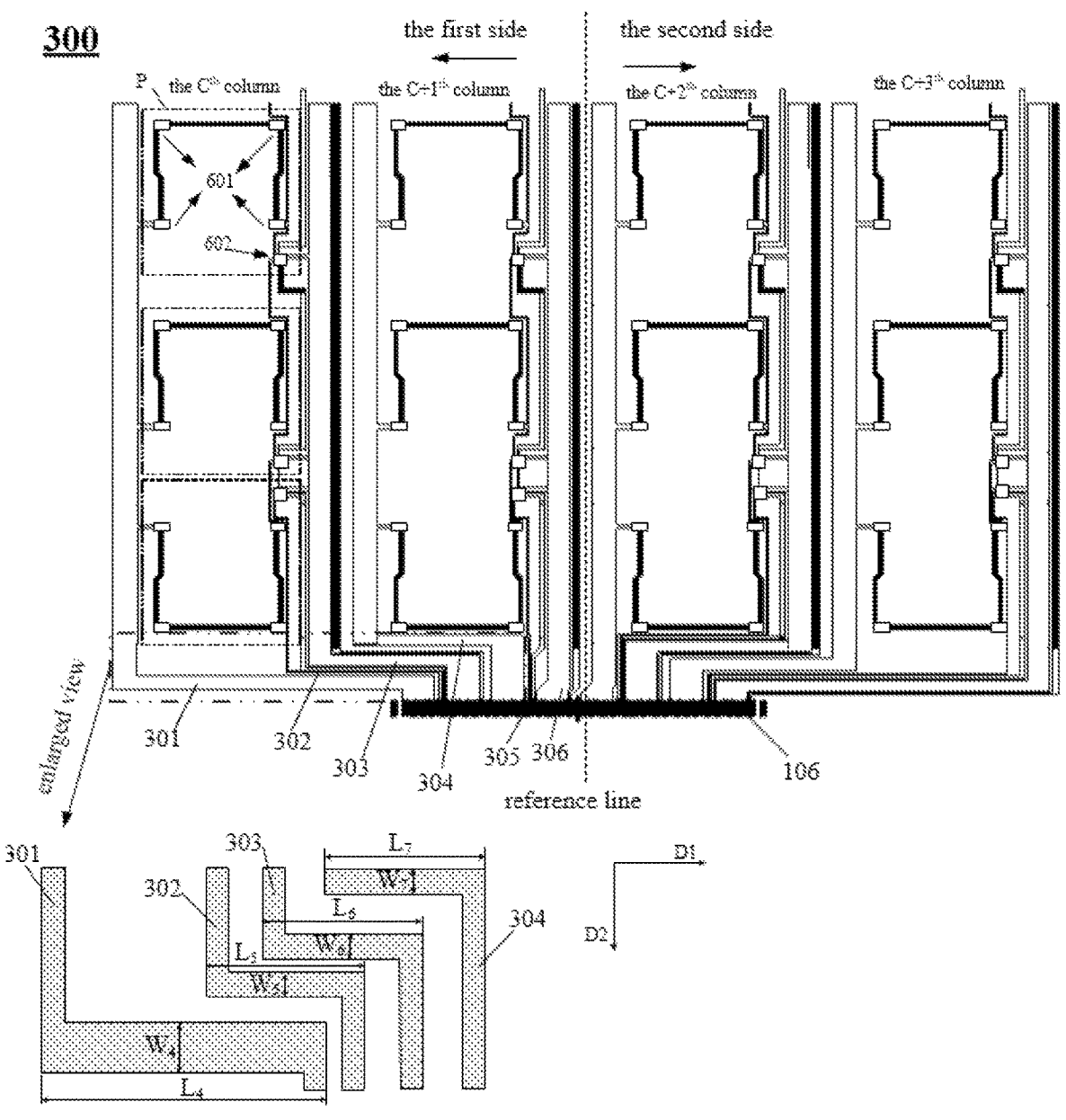
FIG. 5 illustrates a schematic plan view of a portion of a wiring substrate according to another embodiment of the present disclosure.

FIG. 5 illustrates a partial schematic plan view of the wiring substrate 300, which illustrates a plurality of target signal lines. The plurality of target signal lines respectively transmit electrical signals to four columns of partitions. The plurality of target signal lines are connected to the same circuit board 106 in the bonding region, and a plurality of bonding electrodes arranged at intervals are arranged in the bonding region. FIG. 5 illustrates four columns of partitions of the wiring substrate 300, if such four columns of partitions are used as a repeating unit, in some embodiments, the wiring substrate 300 comprises a plurality of such repeating units. As illustrated in FIG. 5, taking the center line of the circuit board 106 parallel to the second direction D2 as a reference line, the $C^{th}$ column of partitions and the $C+1^{th}$ column of partitions are arranged on the first side of the reference line, and the $C+2^{th}$ column of partitions and the $C+3^{th}$ column of partitions are arranged on the second side of the reference line. The signal lines on the first side of the reference line are electrically connected to the circuit board 106 on the first side of the reference line, and the signal lines on the second side of the reference line are electrically connected to the circuit board 106 on the second side of the reference line. Since the width of the fan-out region along the second direction D2 is positively correlated with the sum of the widths of the target signal lines on either side of the reference line, the set of target signal lines in the method 100 refers to a set of target signal lines on one side of the reference line. For example, in the example of FIG. 5, the set of target signal lines is the set of target signal lines 301, 302, 303 and 304 on the first side of the reference line. It should be noted that, as illustrated in FIG. 5, although six signal lines are arranged on the first side of the reference line, since the signal lines 305 and 306 in the $C+1^{th}$ column of partitions are very close to the reference line and connected to the circuit board 106 in an almost straight line, i.e., the signal lines 305 and 306 have almost no sub-portion extending along the first direction D1 in the fan-out region. it can be considered that the length of the sub-portion of the signal line 305 in the fan-out region and extending along the first direction D1 is zero, and the length of the sub-portion of the signal line 306 in the fan-out region and extending along the first direction D1 is also zero. Therefore, according to the above definition, the signal line 305 and the signal line 306 are non-target signal lines. In the fan-out region, each of the signal lines 301-304 comprises a sub-portion extending along the first direction D1 and a sub-portion extending along the second direction D2 which are sequentially connected, and the signal lines 301-304 all transmit electric signals of constant amplitude, therefore, the signal lines 301-304 are target signal lines. The target signal lines 301, 302, 303 are arranged in the $C^{th}$ column of partitions and the target signal line 304 is arranged in the $C+1^{th}$ column of partitions, that is, four target signal lines are arranged on the first side of the reference line. Number these four target signal lines 301, 302, 303, 304 respectively, for example, the number of the target signal line 301 may be 1, the number of the target signal line 302 may be 2, the number of the target signal line 303 may be 3, and the number of the target signal line 304 may be 4. In some embodiments, the target signal lines 301 and 304 may be driving voltage signal lines VLED, the target signal line 301 is configured to provide a first constant voltage to the light-emitting unit 601 in the $C^{th}$ column of partitions, and the target signal line 304 is configured to provide a third constant voltage to the light-emitting unit 601 in the $C+1^{th}$ column partition. The target signal line 302 may be a power supply voltage signal line Pwr, and the target signal line 302 is electrically connected to the power supply terminal of the driving circuit (not illustrated) in the $C^{th}$ column of partitions. The target signal line 303 may be a common voltage signal line GND, and the target signal line 303 is configured to provide a second constant voltage (such as a ground voltage) to the driving circuit in the $C^{th}$ column of partitions.

The method 100 is also applicable to allocate widths to the target signal lines illustrated in FIG. 5, for example, the following steps may be used to allocate widths to the target signal lines 301-304 respectively.

Step S101: numbering the four target signal lines 301-304 respectively 1-4.

Step S102: performing steps S103-S107 four times, until the number of target signal lines to be allocated widths in the set is 0.

Step S103: determining a set of target signal lines to be allocated widths.

Step S104: determining a planar region R based on conditions satisfied by a voltage drop V and a temperature rise T of each of the target signal lines to be allocated widths and widths W of the target signal lines to be allocated widths, the voltage drop V being a function V (L, W) of a length L and a width W, the length L referring to a length along a first direction D1 of a sub-portion of each target signal line in the fan-out region, the width W referring to a width along a second direction D2 of a sub-portion of each target signal line in the fan-out region, and the second direction D2 intersecting with the first direction D1.

Step S105: determining a number i of the target signal line with the maximum voltage drop among the target signal lines to be allocated widths in the set.

Step S106: substituting a known length $L_i$ of the target signal line numbered i into V (L, W) to obtain V ($L_i$, W), obtaining a $W_i$ based on an intersection of V ($L_i$, W) and a boundary of the planar region R, $W_i$ being a width along the second direction D2 of a sub-portion of the target signal line numbered i in the fan-out region and extending along the first direction.

Step S107: removing the target signal line that has been allocated width $W_i$ from the set.

For the specific operation of each step in steps S103-S107, reference may be made to the description of FIGS. 2-4, and for the sake of brevity, details are not repeated here. It should be noted that the embodiment in FIG. 5 corresponds to an initial dynamic width threshold $W_{allow1}$ equal to 3.4 mm.

As illustrated in FIG. 5, the sub-portion of the target signal line 301 in the fan-out region and extending along the first direction has a known length La along the first direction D1, which is 20100 μm, the sub-portion of the target signal line 302 in the fan-out region and extending along the first direction has a known length Ls along the first direction D1, which is 9730 μm, the sub-portion of the target signal line 303 in the fan-out region and extending along the first direction has a known length $L_6$ along the first direction D1, which is 11840 μm, and the sub-portion of the target signal line 304 in the fan-out region and extending along the first direction has a known length $L_7$ along the first direction D1, which is 9720 μm. Through the above method 100, the sub-portions of the target signal lines 301-304 in the fan-out region and extending along the first direction are respectively allocated widths, so that the sub-portion of the target signal line 301 in the fan-out region and extending along the first direction has a width $W_4$ of 996 μm along the second direction D2, the sub-portion of the target signal line 302 in the fan-out region and extending along the first direction has a width $W_5$ of 200 μm along the second direction D2, the sub-portion of the target signal line 303 in the fan-out region and extending along the first direction has a width $W_6$ of 776 μm along the second direction D2, and the sub-portion of the target signal line 304 in the fan-out region and extending along the first direction has a width $W_7$ of 690 μm along the second direction D2. Among the target signal lines 301-304, the voltage drop of the target signal line 301 is the largest, so the width $W_4$ allocated to the target signal line 301 is the maximum value among $W_1$-$W_4$.

Compared with the related art, on the premise of not occupying more width of the fan-out region to widen the frame or not increasing the thickness of the target signal line, the widths of the sub-portions of the four target signal lines 301, 302, 303, 304 in the fan-out region and extending along the first direction have different values according to their respective lengths and voltage drops, instead of having a uniform width. Through the method 100, the width $W_4$ of the target signal line 301 with the maximum voltage drop is significantly increased, so that the voltage drop of the target signal line 301 is significantly reduced and is lower than the voltage drop threshold $V_{limit}$, thus the overall voltage drop level of the wiring substrate 300 is significantly improved.

In other undescribed embodiments, there may be a case that two adjacent columns of partitions share one (or several) signal lines. In this case, the number of target signal lines is reduced accordingly.

According to another aspect of the present disclosure, a wiring substrate is provided. Referring to FIGS. 3-5, the wiring substrate comprises: a base substrate 105 comprising a fan-out region; and at least one target signal line on the base substrate 105 and at least in the fan-out region, a sub-portion of each of the at least one target signal line having a length L along a first direction D1, the sub-portion of each of the at least one target signal line having a width W along a second direction D2 intersecting with the first direction D1, the sub-portion being a portion of each of the at least one target signal line in the fan-out region and extending along the first direction D1. The width W of each target signal line is determined according to the method 100 described in any of the foregoing embodiments.

The fan-out region of the wiring substrate 200 is usually provided with a plurality of signal lines. Among these multiple signal lines, some of the signal lines have low requirements on the resistance of the signal lines due to the transmission of digital signals, and the size design of such signal lines in the fan-out region is not within the discussion scope of the embodiments of the present disclosure, that is, they are "non-target signal lines". The others of the signal lines among the plurality of signal lines transmit electrical signals with constant amplitude, such as constant voltage signals or constant current signals, and the design of their size parameters has a significant impact on the overall voltage drop level of the wiring substrate 200, the widths of these signal lines in the fan-out region are within the discussion scope of the embodiments of the present disclosure, and these signal lines refer to "target signal lines" herein. In some embodiments, as illustrated in FIG. 3 and FIG. 4, the target signal lines comprise a driving voltage signal line VLED and a common voltage signal line GND, for example, the target signal lines 101 and 103 may be the driving voltage signal lines VLED, and the target signal line 102 may be the common voltage signal line GND. The target signal lines 101 and 102 may be in the same column of partitions, and the target signal line 103 may be in the adjacent column of partitions. In an alternative embodiment, as illustrated in FIG. 5, the target signal lines comprise a driving voltage signal line VLED, a power supply voltage signal line PWR and a common voltage signal line GND. For example, the target signal line 301 may be the driving voltage signal line VLED, the target signal line 302 may be the power supply voltage signal line PWR, the target signal line 303 may be the common voltage signal line GND, the target signal lines 301, 302, 303 are in the $C^{th}$ column of partitions. The target signal line 304 may be the driving voltage signal line VLED and is in the $C+1^{th}$ column of partitions. The target signal line 301 is configured to provide a first constant voltage to the light-emitting unit 601 in the $C^{th}$ column of partitions, the target signal line 304 is configured to provide the first constant voltage to the light-emitting unit 601 in the $C+1^{th}$ column of partitions, the target signal line 302 is connected to the power supply terminal of the driving circuit (not shown) in the $C^{th}$ column of partitions, and the target signal line 303 is configured to provide a second constant voltage (such as a ground voltage) to the driving circuit in the $C^{th}$ column of partitions.

As illustrated in FIG. 4, in some embodiments, the wiring substrate further comprises bonding electrodes 104 arranged in the fan-out region, and the portion of each target signal line in the fan-out region is electrically connected to at least two bonding electrodes 104.

The number of target signal lines is N, N is a positive integer greater than or equal to 2, and the sub-portions of the N target signal lines in the fan-out region and extending along the first direction D1 have N widths. As described above, the largest width among the N widths corresponds to a target signal line with the maximum voltage drop among the N target signal lines. Since the overall voltage drop level of the wiring substrate is limited by the maximum voltage drop, by making the target signal line with the maximum voltage drop have the largest width in the fan-out region, the voltage drop of the target signal line can be significantly reduced, so that the voltage drop of the target signal line is below the voltage drop threshold $V_{limit}$, and the overall voltage drop level of the wiring substrate can be significantly improved.

For the technical effect of the wiring substrate, reference may be made to the technical effect of the method 100 described in the foregoing embodiments, and for the purpose of brevity, the technical effect of the wiring substrate will not be repeated here.

According to another aspect of the present disclosure, a light-emitting substrate is provided, and FIG. 6 illustrates a schematic plan view of a light-emitting substrate 600. The light-emitting substrate 600 comprises: the wiring substrate described in any one of the previous embodiments, the base substrate 105 of the wiring substrate also comprising a functional region, the functional region comprising a plurality of partitions P arranged in an array, and the term "functional region" referring to a region on the base substrate 105 for arranging functional components (such as light-emitting elements); a plurality of light-emitting elements arranged in the plurality of partitions P in the functional region; and a circuit board 603 arranged in the fan-out region.

As illustrated in FIG. 6, the plurality of partitions are arranged in the functional region of the light-emitting substrate 600, and each dotted rectangular box in FIG. 6 represents a partition P. Each partition P is provided with a light-emitting unit 601, and optionally, a driving circuit 602 electrically connected to the light-emitting unit 601. The driving circuit 602 can control the light-emitting performance of the light-emitting unit 601. In some embodiments, each light-emitting unit 601 may comprise a plurality of light-emitting elements, and the plurality of light-emitting elements may be connected in series, in parallel, or in series and parallel. Each light-emitting unit may be composed of at least one light-emitting element such as a light-emitting diode (LED), a mini light-emitting diode (Mini LED), or a micro light-emitting diode (Mirco LED). When the light-emitting element is a Mini LED or a Mirco LED, it has a smaller size than the LED, so that it can make each partition P of the light-emitting substrate 600 have a smaller size or make the wiring space of the signal lines on the light-emitting substrate 600 more abundant. The light-emitting unit 601 in each partition P can be individually addressed and powered, so that the light-emitting brightness of the light-emitting substrate 600 is more precise. Compared with the traditional light-emitting substrate, the light-emitting substrate 600 using Mini LED or Mirco LED as the light source can realize regional dimming in a smaller range, thereby achieving better brightness uniformity, higher color contrast and thinner product appearance. When such wiring substrate 600 is applied to a display device, the display effect of the display device is comparable to that of an OLED display device. However, the cost is only about 60% of the OLED display device, and the service life of the product is greatly improved compared with the OLED display device.

FIG. 6 illustrates partitions of k rows*3 columns as an example, which is only a partial schematic view of the light-emitting substrate 600. In fact, as known to those skilled in the art, the light-emitting substrate 600 should comprise partitions of multiple rows*multiple columns. As illustrated in FIG. 6, two target signal lines are arranged in each column of partitions. A target signal line 108 and a target signal line 109 are arranged in the first column of partitions, the target signal line 108 is electrically connected to all light-emitting units 601 in the first column of partitions and may be a driving voltage signal line VLED, the target signal line 109 is electrically connected to all driving circuits 602 in the first column of partitions and may be a common voltage signal line GND. Similarly, a target signal line 101 and a target signal line 107 are arranged in the second column of partitions, the target signal line 101 is electrically connected to all light-emitting units 601 in the second column of partitions and may be a driving voltage signal line VLED, and the target signal line 107 is electrically connected to all driving circuits 602 in the second column of partitions and may be a common voltage signal line GND. A target signal line 102 and a target signal line 103 are arranged in the third column of partitions, the target signal line 103 is electrically connected to all light-emitting units 601 in the third column of partitions and may be a driving voltage signal line VLED, and the target signal line 102 is electrically connected to all driving circuits 602 in the third column of partitions and may be a common voltage signal line GND. Each of the target signal lines 101, 102, 103, 107, 108, 109 is arranged in the functional region and the fan-out region. In the functional region, each of the target signal lines 101, 102, 103, 107, 108, 109 extends substantially in a straight line along the second direction D2. In the fan-out region, each of the target signal lines 101, 102, 103, 107, 108, 109 comprises a sub-portion extending along the first direction D1, and the sub-portion of each target signal line has a length L along the first direction and a width W along the second direction D2 as described above. For example, the length $L_1$ in the first direction D1 of the sub-portion of the target signal line 101 in the fan-out region and extending along the first direction D1 is about 12882 μm, and the width $W_1$ in the second direction D2 of the sub-portion of the target signal line 101 in the fan-out region and extending along the first direction D1 is about 710 μm; the length $L_2$ in the first direction D1 of the sub-portion of the target signal line 102 in the fan-out region and extending along the first direction D1 is about 13010 μm, and the width $W_2$ in the second direction D2 of the sub-portion of the target signal line 102 in the fan-out region and extending along the first direction D1 is about 710 μm; the length $L_3$ in the first direction D1 of the sub-portion of the target signal line 103 in the fan-out region and extending along the first direction D1 is about 23380 μm, and the width $W_3$ in the second direction D2 of the sub-portion of the target signal line 103 in the fan-out region and extending along the first direction D1 is about 1036 μm. Compared with the related art, on the premise of not occupying more width of the fan-out region to widen the frame or not increasing the thickness of the target signal line, the widths of three target signal lines 101, 102, 103 in the fan-out region have different values according to their respective lengths and voltage drops in the fan-out region, instead of having a uniform width. The width $W_3$ of the target signal line 103 with the maximum voltage drop is the maximum value among $W_1$, $W_2$, and $W_3$. Compared with the related art, the voltage drop of the target signal line 103 is significantly reduced and is lower than the voltage drop threshold $V_{limit}$. In addition, since the overall voltage drop level of the light-emitting substrate 600 is limited by the maximum voltage drop, while the voltage drop of the target signal line 103 has been significantly reduced, the overall voltage drop level of the light-emitting substrate 600 is actually significantly improved.

As illustrated in FIG. 6, target signal lines 101, 102, 103, 107, 108, 109 are electrically connected to the same circuit board 603 via a plurality of bonding electrodes 104. In some embodiments, the circuit board 603 may be a chip on film. Taking the center line of the circuit board 603 parallel to the second direction D2 as a reference line, the target signal lines 101, 102, 103 on the first side of the reference line are electrically connected to the circuit board 603 via the bonding electrodes 104 on the first side of the reference line, and the target signal lines 107, 108, 109 on the second side of the reference line are electrically connected to the circuit board 603 via the bonding electrodes 104 on the second side of the reference line. Although not illustrated in FIG. 6, the fan-out region of the light-emitting substrate 600 may further comprise a flexible circuit board (FPC) and a printed circuit board (PCBA). One end of the FPC is connected to the circuit board 603, and the other end of the FPC is connected to the PCBA. The control signals of the IC on the PCBA are transmitted to the bonding electrodes 104 via the FPC and the circuit board 603. Sub-portions in the fan-out region of multiple target signal lines (such as target signal lines 101, 103, 108) on the light-emitting substrate 600 are bound to the bonding electrodes 104, and the portions in the functional region of the multiple target signal lines (such as target signal lines 101, 103, 108) on the light-emitting substrate 600 are electrically connected to the light-emitting units 601. Therefore, the control signals of the IC on the PCBA can be transmitted to the light-emitting units 601 via the target signal lines to control the light-emitting units 601 to emit light.

Although FIG. 6 is described by taking the target signal line 101 in the second column of partitions and the target signal lines 102 and 103 in the adjacent third column of partitions as an example, this is only an example. The position of the target signal line can be flexibly changed according to the design requirements of the product, the amplitude and use of the signal transmitted by the target signal line.

For other technical effects of the light-emitting substrate 600, reference may be made to the foregoing technical effects of the method 100, and for the sake of brevity, the technical effects of the light-emitting substrate 600 will not be repeated here.

According to still another aspect of the present disclosure, a display device is provided. FIG. 7 illustrates a block diagram of a display device 700 comprising the wiring substrate or light-emitting substrate described in any one of the preceding embodiments. In some embodiments, the display device 700 may be a liquid crystal display device, which comprises a liquid crystal panel and a backlight arranged on the non-display side of the liquid crystal panel, and the backlight comprises the wiring substrate described in any of the previous embodiments. The backlight can be used to implement HDR dimming for display operation. The liquid crystal display device can have more uniform backlight brightness and better display contrast. The display device 700 may be any suitable display device, comprising but not limited to mobile phones, tablet computers, televisions, monitors, notebook computers, digital photo frames, navigators, e-books, and any other products or components with display functions.

Since the display device 700 can have substantially the same technical effect as the wiring substrate or light-emitting substrate described in the previous embodiments, for the sake of brevity, the technical effect of the display device 700 will not be repeated here.

It will be understood that although the terms first, second, third, etc. may be used herein to describe various elements, components, regions, layers and/or portions, these elements, components, regions, layers and/or portions should not be limited by these terms. These terms are only used to distinguish an element, component, region, layer or portion from another element, component, region, layer or portion. Thus, a first element, component, region, layer or portion discussed above could be termed a second element, component, region, layer or portion without departing from the teachings of the present disclosure.

Spatially relative terms such as "row", "column", "below", "above", "left", "right", etc. may be used herein for ease of description to describe factors such as the relationship of an element or feature to another element(s) or feature(s) illustrated in the figures. It will be understood that these spatially relative terms are intended to encompass different orientations of the device in use or operation in addition to the orientation depicted in the figures. For example, if the device in the figures is turned over, elements described as "below" other elements or features would then be oriented "above" other elements or features. Thus, the exemplary term "below" can encompass both an orientation of above and below. The device may be otherwise oriented (rotated 90 degrees or at other orientations) and the spatially relative descriptors used herein are interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to limit the present disclosure. As used herein, the singular forms "a," "an," and "the" are intended to comprise the plural forms as well, unless the context clearly dictates otherwise. It will be further understood that the terms "comprise" and/or "include" when used in this specification designate the presence of stated features, integers, steps, operations, elements and/or parts, but do not exclude the presence or addition of one or more other features, integers, steps, operations, elements, components and/or groups thereof. As used herein, the term "and/or" comprises any and all combinations of one or more of the associated listed items. In the description of this specification, description with reference to the terms "an embodiment," "another embodiment," etc. means that a particular feature, structure, material, or characteristic described in connection with the embodiment is included in at least one embodiment of the present disclosure. In this specification, schematic representations of the above terms are not necessarily directed to the same embodiment or example. Furthermore, the particular features, structures, materials or characteristics described may be combined in any suitable manner in any one or more embodiments or examples. Furthermore, those skilled in the art may combine the different embodiments or examples as well as the features of the different embodiments or examples described in this specification without conflicting each other.

It will be understood that when an element or layer is referred to as being "on", "connected to", "coupled to", or "adjacent to" another element or layer, it may be directly on, directly connected to, directly coupled to, or directly adjacent to another element or layer, or intervening elements or layers may be present. In contrast, when an element is referred to as being "directly on", "directly connected to", "directly coupled to", "directly adjacent to" another element or layer, with no intervening elements or layers present. However, in no case should "on" or "directly on" be interpreted as requiring a layer to completely cover the layer below.

Embodiments of the disclosure are described herein with reference to schematic illustrations (and intermediate structures) of idealized embodiments of the disclosure. As such, variations to the shapes of the illustrations are to be expected, e.g., as a result of manufacturing techniques and/or tolerances. Accordingly, embodiments of the present disclosure should not be construed as limited to the particular shapes of the regions illustrated herein, but are to comprise deviations in shapes due, for example, to manufacturing. Thus, the regions illustrated in the figures are schematic in nature and their shapes are not intended to illustrate the actual shape of a region of a device and are not intended to limit the scope of the present disclosure.

Unless otherwise defined, all terms (comprising technical and scientific terms) used herein have the same meaning as commonly understood by one of ordinary skill in the art to which this disclosure belongs. It will be further understood that terms such as those defined in commonly used dictionaries should be construed to have meanings consistent with their meanings in the relevant art and/or the context of this specification, and will not be idealized or overly interpreted in a formal sense, unless expressly defined as such herein.

The above descriptions are merely specific embodiments of the present disclosure, but the protection scope of the present disclosure is not limited thereto. Any changes or substitutions that those skilled in the art can easily think of within the technical scope disclosed by the present disclosure, should be comprised within the protection scope of the present disclosure. Therefore, the protection scope of the present disclosure should be based on the protection scope of the claims.

The invention claimed is:

1. A method of allocating widths for target signal lines, comprising:

numbering at least one target signal line respectively;

performing the following operations at least once until a number of target signal lines to be allocated widths in a set is zero:

determining the set of target signal lines to be allocated widths;

determining a planar region R based on conditions satisfied by a voltage drop V and a temperature rise T of each of the target signal lines to be allocated widths and widths W of the target signal lines to be allocated widths, the voltage drop V being a function $V (L, W)$ of a length L and a width W, the length L referring to a length of a sub-portion along a first direction, the width W referring to a width of the sub-portion along a second direction intersecting with the first direction, the sub-portion being a portion of each target signal line in a fan-out region and extending along the first direction;

determining a number i of a target signal line with a maximum voltage drop among the target signal lines to be allocated widths in the set;

substituting a known length $L_i$ of the target signal line numbered i into V (L, W) to obtain V ($L_i$, W), obtaining a $W_i$ based on an intersection of V ($L_i$, W) and a boundary of the planar region R, the $W_i$ being the width of the sub-portion of the target signal line numbered i along the second direction, the sub-portion of the target signal line numbered i being the portion of the target signal line numbered i in the fan-out region and extending along the first direction; and removing the target signal line that has been allocated width $W_i$ from the set.

2. The method according to claim 1, wherein a number of the target signal lines is N, N is a positive integer greater than or equal to 2, the N target signal lines have N widths, a width of the target signal line with the maximum voltage drop among the N target signal lines is a maximum among the N widths.

3. The method according to claim 1- or 2, wherein the temperature rise T is a function T (L, W) of the length L and the width W, the determining a planar region R based on conditions satisfied by a voltage drop V and a temperature rise T of each of the target signal lines to be allocated widths and widths W of the target signal lines to be allocated widths, comprises:

determining the planar region R based on a set of inequalities consisting of the following inequalities: the voltage drop V (L, W) of each of the target signal lines to be allocated widths being less than a voltage drop threshold, the temperature rise T (L, W) of each of the target signal lines to be allocated widths being less than a temperature rise threshold, and a sum of the widths W of the target signal lines to be allocated widths being less than a dynamic width threshold.

4. The method according to claim 3, wherein the determining a number i of a target signal line with a maximum voltage drop among the target signal lines to be allocated widths in the set, comprises:

substituting $W_0$ into V (L, W) to obtain V (L, $W_0$), $W_0$ being associated with the dynamic width threshold;

substituting the known length of each of the target signal lines to be allocated widths in the set into V (L, $W_0$) respectively to obtain a set of different voltage drops;

selecting a maximum voltage drop from the set of different voltage drops; and determining the number i of the target signal line with the maximum voltage drop according to the known length corresponding to the maximum voltage drop.

5. The method according to claim 1, wherein the voltage drop V (L, W) of each target signal line satisfies the following formula:

V (L, W)=E+F*L/W, where both E and F are constants.

6. The method according to claim 5, wherein $$V(L, W) = R_{pixel} * \sum_{j=1}^{j=k} I_j + R(L, W) * I_k,$$

wherein the target signal lines are also in a functional region, the functional region comprises a plurality of partitions arranged in an array, $R_{pixel}$ is a resistance of a section of each target signal line corresponding to a single partition, k is a number of rows of the partitions, $I_j=j*I_0$, $I_k=k*I_0$, $I_0$ is a current of the single partition.

7. The method according to claim 6, wherein R (L, W)=$R_s$*L/W, $R_s$ is a sheet resistance of the target signal line, E=k*(k+1)/2*$I_0$*$R_{pixel}$, F=k*$I_0$*$R_s$.

8. The method according to claim 3, wherein the temperature rise T (L, W) of each target signal line satisfies the following formula:

$$T(L, W) = \left[ (1/(L*W*X)^Y)/(I/C) \right]^{1/Q},$$

where I is a current transmitted by each target signal line, X, Y, C, Q are constants.

9. A wiring substrate comprising:

a base substrate comprising a fan-out region; and at least one target signal line on the base substrate and at least in the fan-out region, a sub-portion of each of the at least one target signal line having a length L along a first direction and a width W along a second direction intersecting with the first direction, the sub-portion being a portion of each of the at least one target signal line in the fan-out region and extending along the first direction, wherein the width W of each target signal line is determined according to the method of claim 1.

10. The wiring substrate according to claim 9, wherein a number of the target signal lines is N, N is a positive integer greater than or equal to 2, the N target signal lines have N widths, a width of the target signal line with a maximum voltage drop among the N target signal lines is a maximum among the N widths.

11. The wiring substrate according to claim 9, further comprising bonding electrodes in the fan-out region, wherein each target signal line is electrically connected to at least two bonding electrodes.

12. The wiring substrate according to claim 9, wherein the target signal line comprises at least one of a driving voltage signal line, a common voltage signal line, or a power supply voltage signal line.

13. A light-emitting substrate comprising:

the wiring substrate according to claim 9, wherein the base substrate further comprises a functional region comprising a plurality of partitions arranged in an array;

a plurality of light-emitting elements in the plurality of partitions in the functional region; and a circuit board in the fan-out region.

14. The light-emitting substrate according to claim 13, wherein the plurality of partitions are in multiple rows and columns, a number of the target signal lines is N, N is a positive integer greater than or equal to 2, the N target signal lines are also in the functional region along the second direction, and the N target signal lines are in a same column of partitions or in M adjacent columns of partitions, M is a positive integer greater than or equal to 2.

15. The light-emitting substrate according to claim 14, wherein the circuit board comprises a chip on film, and the N target signal lines are electrically connected to a same circuit board via bonding electrodes.

16. The light-emitting substrate according to claim 13, wherein each of the plurality of light-emitting elements comprises a Mini light-emitting diode.

17. A display device comprising the wiring substrate according to claim 9.

18. A display device comprising the light-emitting substrate according to claim 13.

* * * * *